US008660161B2

(12) United States Patent
Brenner et al.

(10) Patent No.: US 8,660,161 B2
(45) Date of Patent: *Feb. 25, 2014

(54) PUSH-PULL MODULATED COUPLED VERTICAL-CAVITY SURFACE-EMITTING LASERS AND METHOD

(75) Inventors: Mary K. Brenner, Plymouth, MN (US); Klein L. Johnson, Orono, MN (US)

(73) Assignee: Vixar, Inc., Plymouth, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/571,839

(22) Filed: Aug. 10, 2012

(65) Prior Publication Data

US 2012/0300800 A1 Nov. 29, 2012

Related U.S. Application Data

(60) Continuation of application No. 13/163,434, filed on Jun. 17, 2011, now Pat. No. 8,249,121, which is a division of application No. 12/710,156, filed on Feb. 22, 2010, now abandoned.

(60) Provisional application No. 61/208,200, filed on Feb. 20, 2009.

(51) Int. Cl.
*H01S 5/00* (2006.01)

(52) U.S. Cl.
USPC .................................................... 372/46.01

(58) Field of Classification Search
USPC ................... 372/46.01, 50.11, 75; 438/32
See application file for complete search history.

(56) References Cited

U.S. PATENT DOCUMENTS

| 5,719,891 A * | 2/1998 | Jewell ...................... 372/46.013 |
|---|---|---|
| 5,893,722 A | 4/1999 | Hibbs-Brenner et al. |
| 6,611,539 B2 | 8/2003 | Ledentsov et al. |
| 6,936,486 B2 | 8/2005 | Cheng et al. |
| 7,169,629 B2 * | 1/2007 | Wu et al. ......................... 438/22 |
| 7,215,692 B2 | 5/2007 | Jewell |
| 8,494,018 B2 | 7/2013 | Brenner et al. |
| 2004/0096996 A1 | 5/2004 | Cheng et al. |

OTHER PUBLICATIONS

M.C. Nowell et al. "Low-Chirp and Enhanced-Resonant Frequency by Direct Push-Pull Modulation of DFB Lasers." IEEE Journal Selected Topics of Quantum Electronics, vol. 1, No. 2, pp. 433-441, Jun. 1995.
J. Chen et al. "Dynamic Properties of Push-Pull DFB Semiconductor Lasers." IEEE Journal of Quantum Electronics, vol. 32, No. 12, pp. 2156-2165, Dec. 1996.
P. Pellandini et al. Dual-wavelength laser emission from a coupled semiconductor microcavity. Applied Physics Letters, vol. 71, No. 7, pp. 864-866, Aug. 18, 1997.
A.J. Fischer et al. "Coupled resonator vertical-cavity laser diode." Applied Physics Letters, vol. 75, No. 19, pp. 3020-3022, Nov. 8, 1999.

(Continued)

*Primary Examiner* — Jessica Stultz
*Assistant Examiner* — Tuan Nguyen
(74) *Attorney, Agent, or Firm* — Winthrop & Weinstine, P.A.

(57) ABSTRACT

A laser system having separately electrically operable cavities for emitting modulated narrow linewidth light with first, second and third mirror structures separated by a first active region between the first and the second and by a second active region between the second and the third. The second mirror structure has twenty of more periods of mirror pairs.

20 Claims, 32 Drawing Sheets

(56) References Cited

OTHER PUBLICATIONS

V. Badilita et al. "Rate-Equation Model for Coupled-Cavity Surface-Emitting Lasers." IEEE Journal of Quantum Electronics, vol. 40, No. 12, pp. 1646-1656, Dec. 2004.

A.C. Lehman et al. "Threshold Gain Temperature Dependence of Composite Resonator Vertical-Cavity Lasers." IEEE Journal Selected Topics of Quantum Electronics, vol. 11, No. 5, pp. 962-967, Sep./Oct. 2005.

D.M. Grasso et al. "Direct Modulation Characteristics of Composite Resonator Vertical-Cavity Lasers." IEEE Journal of Quantum Electronics, vol. 42, No. 12, pp. 1248-1254, Dec. 2006.

V.A. Shchukin et al. "Ultrahigh-speed electrooptically-modulated VCSELs: modeling and experimental results." in Proceedings of SPIE, vol. 6889, 2008.

J. van Eisen et al. "Optically Decoupled Loss Modulation in a Duo-Cavity VCSEL." IEEE Photonics Technology Letters, vol. 20, No. 1, pp. 42-44, Jan. 1, 2008.

C. Chen et al. "High-speed electroabsorption modulation of composite-resonator vertical-cavity lasers." IET Optoelectronics, vol. 3, No. 2, pp. 93-99, 2009.

C. Chen et al. "Multilevel Amplitude Modulation Using a Composite-Resonator Vertical-Cavity Laser." IEEE Photonics Technology Letters, vol. 21, No. 15, Aug. 1, 2009.

C. Chen et al. "Microwave Frequency Conversion Using a Coupled Cavity Surface-Emitting Laser." IEEE Photonics Technology Letters, vol. 21, No. 19, pp. 1393-1395, Oct. 1, 2009.

Bohr, Mark et al. "Intel's Revolutionary 22 nm Transistor Technology", Intel, May 2011 (28 pp.).

Chen, Chen et al. "Push-Pull Modulation of a Composite-Resonator Vertical-Capacity Laser", IEEE Journal of Quantum Electronics, vol. 46, No. 4, Apr. 2010 (pp. 438-446).

Young, E.W. et al. "Single-Transverse-Mode Vertical-Cavity Lasers Under Continuous and Pulsed Operation", IEEE Photonics Technology Letters, vol. 13, No. 9, Sep. 2001 (pp. 927-929).

\* cited by examiner

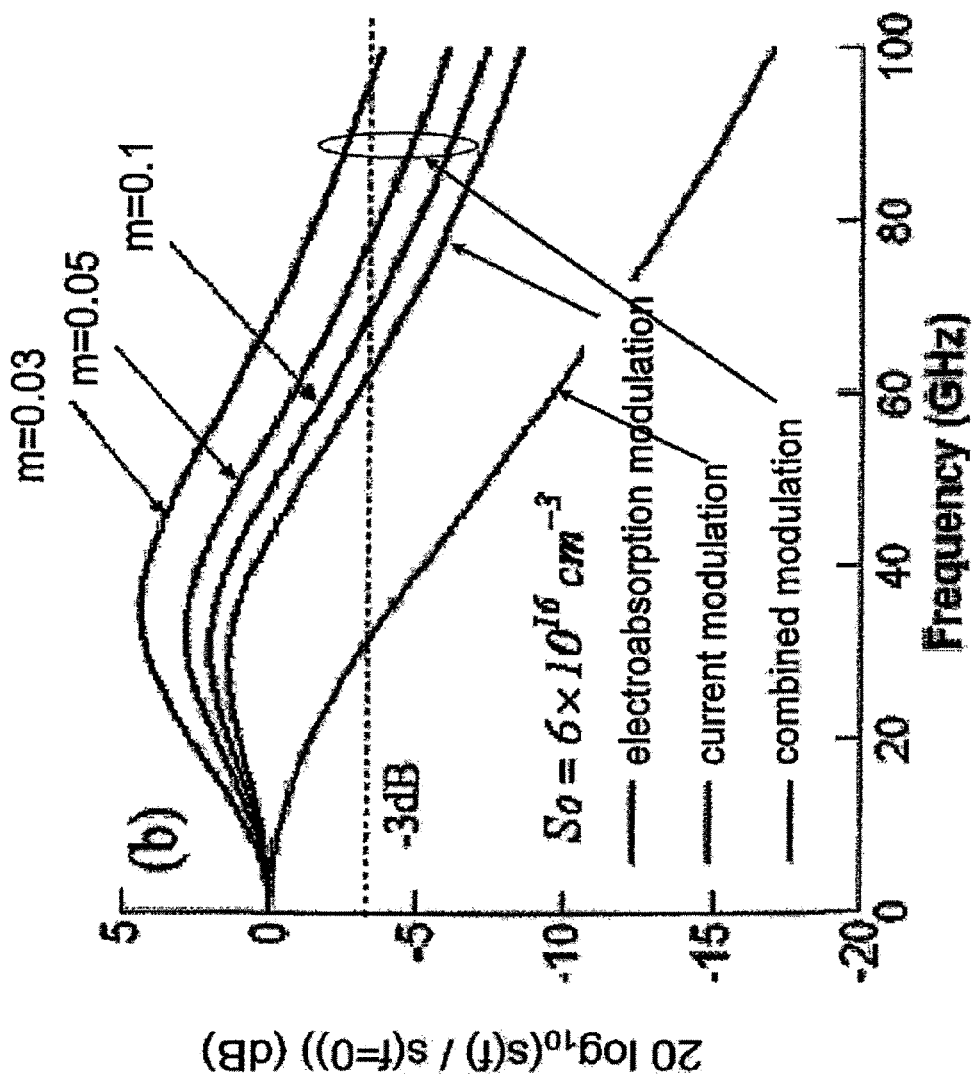

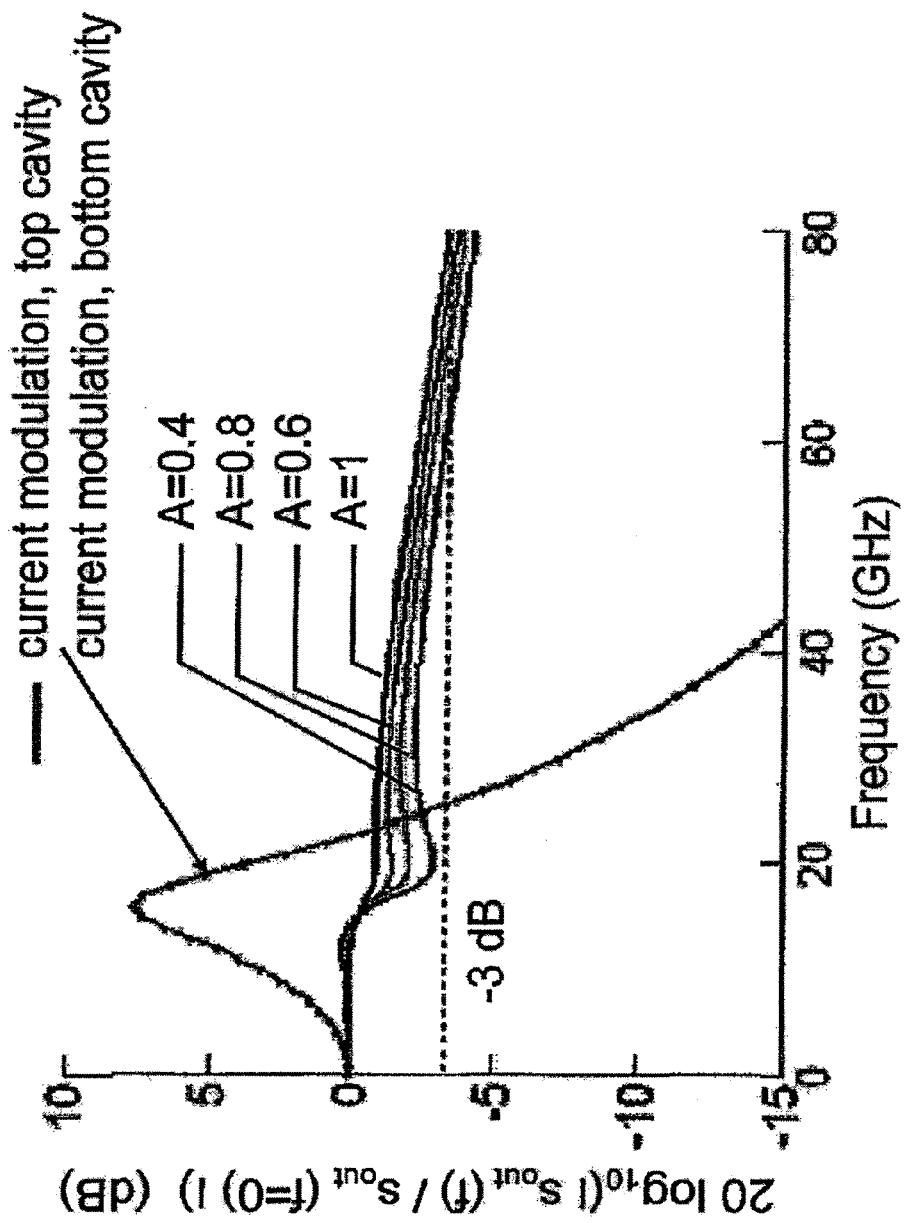

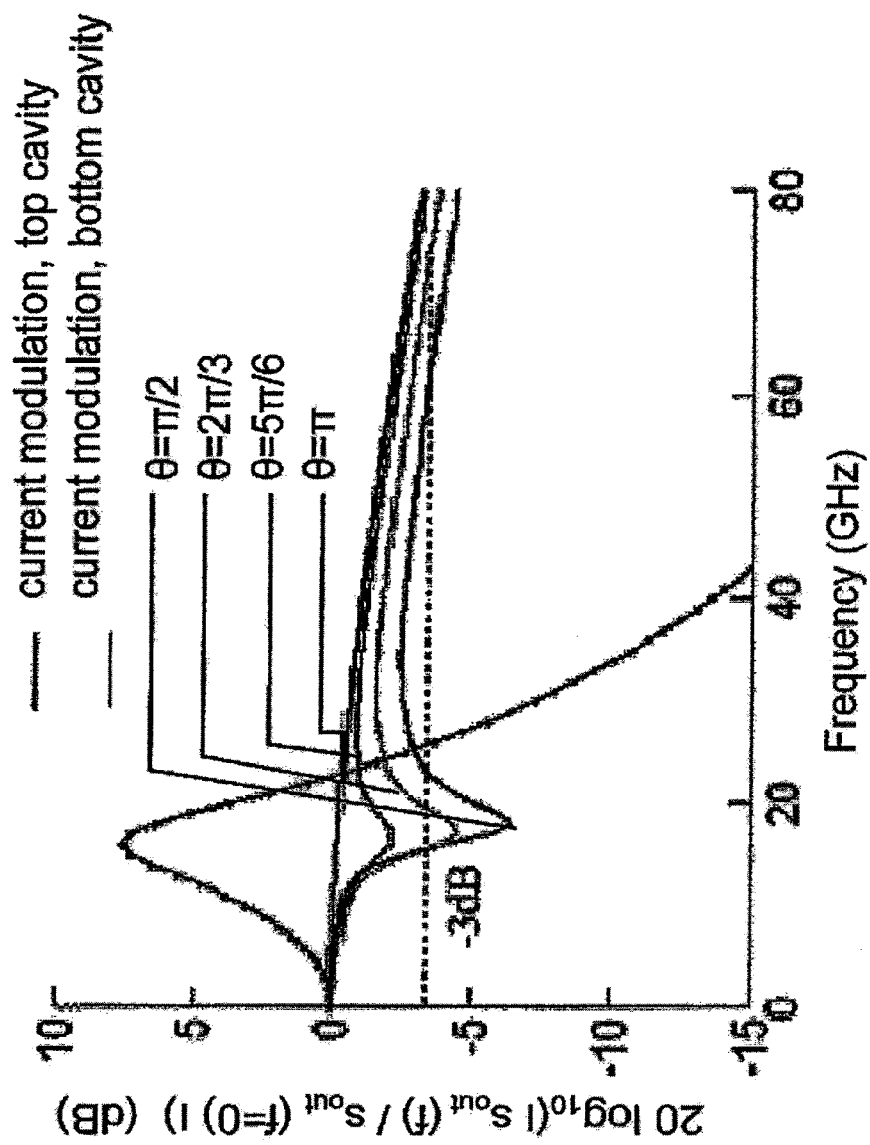

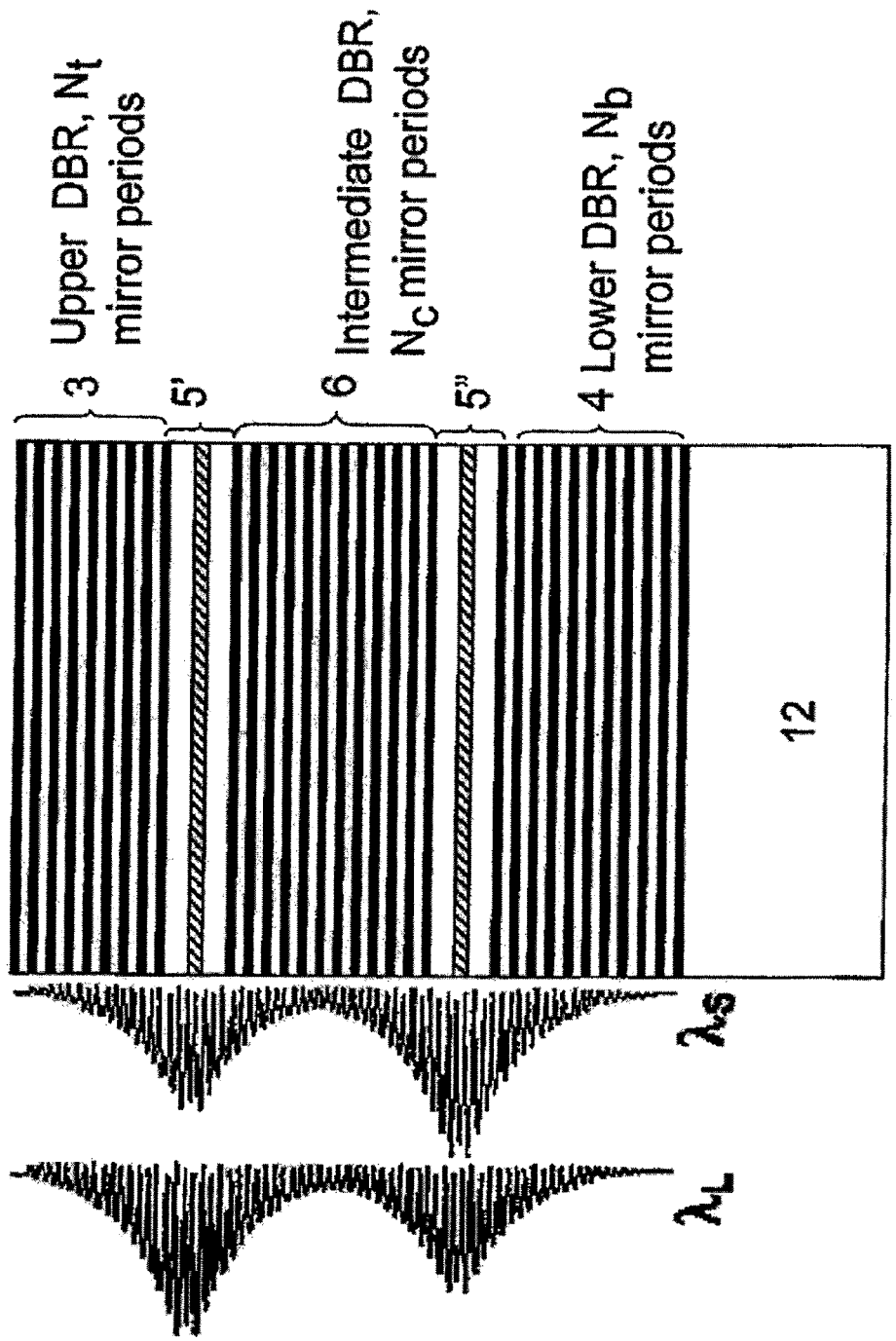

Figure 10

| Number In Text | Layer Description | Layer | Layer Name | Material | Mole Fraction | Thickness (nm) | Type | Dopant | Concentration (cm-3) |
|---|---|---|---|---|---|---|---|---|---|
| 25 | Contact | 104 | Cap | GaAs |  | 15 | N | Si, Se, Te | >8E18 |
| 25 | Current spread | 103 | Current spread | Al(x)GaAs | x=0.15 | 468.92 | N | Si, Se, Te | >6E18 |
| 19 | N-mirror | 102 | Dopant grade | Al(x)GaAs | x=0.15 | 42.00 | N | Si, Se, Te | 2-5E18 |
| 20 | N-mirror | 101 | Grade | Al(x)GaAs | x=0.95 -> 0.15 | 20 | N | Si, Se, Te | 2E18 |
| 18 | N-mirror | 100 | Lo index | Al(x)GaAs | x=0.95 | 48.93 | N | Si, Se, Te | 2E18 |
| 20 | N-mirror | 99 | Grade | Al(x)GaAs | x=0.15 -> 0.95 | 20 | N | Si, Se, Te | 2E18 |
| 19 | N-mirror | 98 x11-14 | Hi index | Al(x)GaAs | x=0.15 | 42.00 | N | Si, Se, Te | 2E18 |
| 20 | N-mirror | 97 | Grade | Al(x)GaAs | x=0.95 -> 0.15 | 20 | N | Si, Se, Te | 2E18 |
| 18 | N-mirror-lo dope | 96 | Lo index | Al(x)GaAs | x=0.95 | 48.93 | N | Si, Se, Te | 1E18 |
| 20 | N-mirror-lo dope | 95 | Grade | Al(x)GaAs | x=0.15 -> 0.95 | 20 | N | Si, Se, Te | 1E18 |
| 19 | N-mirror-lo dope | 94 x6 | Hi index | Al(x)GaAs | x=0.15 | 42.00 | N | Si, Se, Te | 1E18 |
| 20 | N-mirror-lo dope | 93 | Grade | Al(x)GaAs | x=0.95 -> 0.15 | 20 | N | Si, Se, Te | 1E18 |
| 18 | N-mirror-lo dope | 92 | Lo index | Al(x)GaAs | x=0.95 | 48.93 | N | Si, Se, Te | 5E17 |
| 21 | Upper active | 91 | Spacer | Al(x)GaAs | x=065 | 48.81 | N | Si, Se, Te | 5E17 |
| 21 | Upper active | 90 | Spacer | Al(x)GaAs | x=065 | 15 | undoped |  |  |
| 23 | Upper active | 89 | Barrier | Al(x)GaAs | x=0.25 | 20 | undoped |  |  |
| 22 | Upper active | 88 | QW | Al(x)GaAs | x=0 | 7 | undoped |  |  |
| 23 | Upper active | 87 | Barrier | Al(x)GaAs | x=0.25 | 6 | undoped |  |  |
| 22 | Upper active | 86 | QW | Al(x)GaAs | x=0 | 7 | undoped |  |  |
| 23 | Upper active | 85 | Barrier | Al(x)GaAs | x=0.25 | 6 | undoped |  |  |
| 22 | Upper active | 84 | QW | Al(x)GaAs | x=0 | 7 | undoped |  |  |
| 23 | Upper active | 83 | Barrier | Al(x)GaAs | x=0.25 | 6 | undoped |  |  |
| 22 | Upper active | 82 | QW | Al(x)GaAs | x=0 | 7 | undoped |  |  |
| 23 | Upper active | 81 | Barrier | Al(x)GaAs | x=0.25 | 6 | undoped |  |  |
| 22 | Upper active | 80 | QW | Al(x)GaAs | x=0 | 7 | undoped |  |  |
| 23 | Upper active | 79 | Barrier | Al(x)GaAs | x=0.25 | 20 | undoped |  |  |

Figure 10 (continued)

| | | | | | | | | |
|---|---|---|---|---|---|---|---|---|
| Upper active | 78 | | Spacer | Al(x)GaAs | x=0.65 | 63.81 | P | | 1e18 |
| P-mirror lo dopin | 77 | | Lo index | Al(x)GaAs | x=0.95 | 48.93 | P | C | 1.5E18 |
| P-mirror lo dopin | 76 | | Grade | Al(x)GaAs | x=0.95 -> 0.15 | 20 | P | C | 1.5E18 |
| P-mirror lo dopin | 75 | x2 | Hi index | Al(x)GaAs | x=0.15 | 42.00 | P | C | 1.5E18 |
| P-mirror lo dopin | 74 | | Grade | Al(x)GaAs | x=0.15 -> 0.95 | 20 | P | C | 1.5E18 |
| P-mirror lo dopin | 73 | | Lo index | Al(x)GaAs | x=0.95 | 48.93 | P | C | 1.5E18 |
| P-mirror lo dopin | 72 | | Grade | Al(x)GaAs | x=0.95 -> 0.15 | 20 | P | C | 1.5E18 |
| P-mirror lo dopin | 71 | | Hi index | Al(x)GaAs | x=0.15 | 42.00 | P | C | 1.5E18 |
| P-mirror lo dopin | 70 | | Grade | Al(x)GaAs | x=0.15 -> 0.65 | 12 | P | C | 1.5E18 |
| Oxidation | 69 | | Ox stop | Al(x)GaAs | x=0.65 | 12 | P | C | 1.5E18 |
| Oxidation | 68 | | Oxidation | Al(x)GaAs | x=0.98 | 20 | P | C | 1.5E18 |
| Oxidation | 67 | | Ox stop | Al(x)GaAs | x=0.97 | 12 | P | C | 1.5E18 |
| P-mirror lo dopin | 66 | | Lo index | Al(x)GaAs | x=0.95 | 5.1 | P | C | 1.5E18 |
| P-mirror lo dopin | 65 | | Grade | Al(x)GaAs | x=0.95 -> 0.15 | 20 | P | C | 1.5E18 |
| P-mirror lo dopin | 64 | x3 | Hi index | Al(x)GaAs | x=0.15 | 42.00 | P | C | 1.5E18 |
| P-mirror lo dopin | 63 | | Grade | Al(x)GaAs | x=0.15 -> 0.95 | 20 | P | C | 1.5E18 |
| P-mirror lo dopin | 62 | | Lo index | Al(x)GaAs | x=0.95 | 48.93 | P | C | 1.5E18 |
| P-mirror | 61 | | Grade | Al(x)GaAs | x=0.95 -> 0.15 | 20 | P | C | 3E18 |
| P-mirror | 60 | | Hi index | Al(x)GaAs | x=0.15 | 42.00 | P | C | 3E18 |
| P-mirror | 59 | x9-16 | Grade | Al(x)GaAs | x=0.15 -> 0.95 | 20 | P | C | 3E18 |
| P-mirror | 58 | | Lo index | Al(x)GaAs | x=0.95 | 48.93 | P | C | 3E18 |
| P-mirror current | 57 | | Grade | Al(x)GaAs | x=0.95 -> 0.15 | 20 | P | C | >5E18 |
| P-mirror current | 56 | | Hi index | Al(x)GaAs | x=0.15 | 42.00 | P | C | >5E18 |
| P-mirror current | 55 | X2-4 | Grade | Al(x)GaAs | x=0.15 -> 0.95 | 20 | P | C | >5E18 |
| P-mirror current | 54 | | Lo index | Al(x)GaAs | x=0.95 | 48.93 | P | C | >5E18 |
| P-mirror current | 53 | | Grade | Al(x)GaAs | x=0.95 -> 0.15 | 20 | P | C | >2E19 |
| Stop etch | 52 | | Stop etch | Ga(y)InP | y=0.51 | 10 | P | Zn or C | >2E19 |
| Contact | 51 | | Contact layer | Al(x)GaAs | x=0 | 12 | P | C | >2E19 |

Figure 10 (continued)

| | | | | | | | | |
|---|---|---|---|---|---|---|---|---|
| 19 | P-mirror current | 50 | Hi index | Al(x)GaAs | x=0.15 | 19.3 | P | C | >2E19 |
| 20 | P-mirror current | 49 | Grade | Al(x)GaAs | x=0.95 -> 0.15 | 20 | P | C | >2E19 |
| 18 | P-mirror current | 48 | Lo index | Al(x)GaAs | x=0.95 | 48.93 | P | C | >5E18 |
| 20 | P-mirror current | 47 } x2-4 | Grade | Al(x)GaAs | x=0.15 -> 0.95 | 20 | P | C | >5E18 |
| 19 | P-mirror current | 46 | Hi index | Al(x)GaAs | x=0.15 | 42.00 | P | C | >5E18 |
| 20 | P-mirror current | 45 } | Grade | Al(x)GaAs | x=0.95 -> 0.15 | 20 | P | C | >5E18 |
| 18 | P-mirror | 44 | Lo index | Al(x)GaAs | x=0.95 | 48.93 | P | C | 3E18 |
| 20 | P-mirror | 43 | Grade | Al(x)GaAs | x=0.15 -> 0.95 | 20 | P | C | 3E18 |
| 19 | P-mirror | 42 } x9-16 | Hi index | Al(x)GaAs | x=0.15 | 42.00 | P | C | 3E18 |
| 20 | P-mirror | 41 } | Grade | Al(x)GaAs | x=0.95 -> 0.15 | 20 | P | C | 3E18 |
| 18 | P-mirror lo dopin | 40 | Lo index | Al(x)GaAs | x=0.95 | 48.93 | P | C | 1.5E18 |
| 20 | P-mirror lo dopin | 39 | Grade | Al(x)GaAs | x=0.15 -> 0.95 | 20 | P | C | 1.5E18 |
| 19 | P-mirror lo dopin | 38 } x3 | Hi index | Al(x)GaAs | x=0.15 | 42.00 | P | C | 1.5E18 |
| 20 | P-mirror lo dopin | 37 } | Grade | Al(x)GaAs | x=0.95 -> 0.15 | 20 | P | C | 1.5E18 |
| 18 | Oxidation | 36 | Lo index | Al(x)GaAs | x=0.95 | 5.1 | P | C | 1.5E18 |
| 33 | Oxidation | 35 | Ox stop | Al(x)GaAs | x=0.97 | 12 | P | C | 1.5E18 |
| 32 | Oxidation | 34 | Oxidation | Al(x)GaAs | x=0.98 | 20 | P | C | 1.5E18 |
| 34 | Oxidation | 33 } x1 | Ox stop | Al(x)GaAs | x=0.65 | 12 | P | C | 1.5E18 |
| 20 | P-mirror | 32 | Grade | Al(x)GaAs | x=0.15 -> 0.65 | 12 | P | C | 1.5E18 |
| 19 | P-mirror lo dopin | 31 | Hi index | Al(x)GaAs | x=0.15 | 42.00 | P | C | 1.5E18 |
| 20 | P-mirror lo dopin | 30 } | Grade | Al(x)GaAs | x=0.95 -> 0.15 | 20 | P | C | 1.5E18 |
| 18 | P-mirror lo dopin | 29 | Lo index | Al(x)GaAs | x=0.95 | 48.93 | P | C | 1.5E18 |
| 20 | P-mirror lo dopin | 28 | Grade | Al(x)GaAs | x=0.15 -> 0.95 | 20 | P | C | 1.5E18 |
| 19 | P-mirror lo dopin | 27 } x2 | Hi index | Al(x)GaAs | x=0.15 | 42.00 | P | C | 1.5E18 |
| 20 | P-mirror lo dopin | 26 } | Grade | Al(x)GaAs | x=0.95 -> 0.15 | 20 | P | C | 1.5E18 |
| 18 | P-mirror lo dopin | 25 | Lo index | Al(x)GaAs | x=0.95 | 48.93 | P | C | 1.5E18 |

Figure 10 (continued)

| Group | | # | Layer | Material | x | Thickness | P | Dopant | Concentration |
|---|---|---|---|---|---|---|---|---|---|
| Lower active | 21 | 24 | Spacer | Al(x)GaAs | x=0.65 | 63.81 | | Zn | 1e18 |
| Lower active | 23 | 23 | Barrier | Al(x)GaAs | x=0.25 | 20 | undoped | | |
| Lower active | 22 | 22 | QW | Al(x)GaAs | x=0 | 7 | undoped | | |
| Lower active | 23 | 21 | Barrier | Al(x)GaAs | x=0.25 | 6 | undoped | | |
| Lower active | 22 | 20 | QW | Al(x)GaAs | x=0 | 7 | undoped | | |
| Lower active | 23 | 19 | Barrier | Al(x)GaAs | x=0.25 | 6 | undoped | | |
| Lower active | 22 | 18 | QW | Al(x)GaAs | x=0 | 7 | undoped | | |
| Lower active | 23 | 17 | Barrier | Al(x)GaAs | x=0.25 | 6 | undoped | | |
| Lower active | 22 | 16 | QW | Al(x)GaAs | x=0 | 7 | undoped | | |
| Lower active | 23 | 15 | Barrier | Al(x)GaAs | x=0.25 | 6 | undoped | | |
| Lower active | 22 | 14 | QW | Al(x)GaAs | x=0 | 7 | undoped | | |
| Lower active | 23 | 13 | Barrier | Al(x)GaAs | x=0.25 | 20 | undoped | | |
| Lower active | 21 | 12 | Spacer | Al(x)GaAs | x=0.65 | 15 | undoped | | |
| Lower active | 18 | 11 | Spacer | Al(x)GaAs | x=0.65 | 48.81 | N | Si, Se, Te | 5E17 |
| N-Mirror-lo dopin | 20 | 10 | Lo index | Al(x)GaAs | x=1 | 49.38 | N | Si, Se, Te | 1E18 |
| N-Mirror-lo dopin | 19 | 9 | Grade | Al(x)GaAs | x=0.15 -> 1 | 20 | N | Si, Se, Te | 1E18 |
| N-Mirror-lo dopin | 20 | 8 | Hi index | Al(x)GaAs | x=0.15 | 42.00 | N | Si, Se, Te | 1E18 |
| N-Mirror-lo dopin (x6) | 18 | 7 | Grade | Al(x)GaAs | x=1 -> 0.15 | 20 | N | Si, Se, Te | 1E18 |
| N-Mirror-lo dopin | 20 | 6 | Lo index | Al(x)GaAs | x=1 | 49.38 | N | Si, Se, Te | 1E18 |
| N-Mirror | 20 | 5 | Grade | Al(x)GaAs | x=0.15 -> 1 | 20 | N | Si, Se, Te | 2E18 |
| N-Mirror | 19 | 4 | Hi index | Al(x)GaAs | 0.15 | 42.00 | N | Si, Se, Te | 2E18 |
| N-Mirror (x14-17) | 20 | 3 | Grade | Al(x)GaAs | x=1 -> 0.15 | 20 | N | Si, Se, Te | 2E18 |
| N-Mirror | 18 | 2 | Lo index | Al(x)GaAs | x=1 | 49.38 | N | Si, Se, Te | 2E18 |
| | 20 | 1 | Graded | Al(x)GaAs | x=0.1 -> 1 | 20 | N | Si, Se, Te | 2E18 |
| | 12 | 0 | Substrate | GaAs | | | N | | |

Figure 11.

| Layer | Material | n@850nm | Thickness (nm) |
|---|---|---|---|
| high index DBR layer | Al0.15Ga0.85As | 3.513 | 60.49 |
| low index DBR layer | Al0.95Ga0.05As | 3.016 | 70.46 |
| cavity spacer | Al0.65Ga0.35As | 3.183 | 91.81 |
| MQW barrier | Al0.25Ga0.75As | 3.438 | 6 |
| QW | GaAs | 3.644 | 7 |
| substrate | GaAs | 3.644 | >10,000 |

Figure 15.

| Parameter | Description | Case1 | Case2 | Case3 | Case4 | Case5 |
|---|---|---|---|---|---|---|
| Nt | Top mirror pairs | 17 | 17 | 17 | 17 | 17 |
| Nc | Center mirror pairs | 25 | 28 | 32 | 35 | 38 |
| Nb | Bottom mirror pairs | 20 | 20 | 20 | 20 | 20 |
| Γ0 | Conf factor intercept | 0.0245 | 0.0245 | 0.0245 | 0.0245 | 0.0245 |
| dΓ/dn | Conf factor slope | 0.2293 | 0.3466 | 0.6230 | 0.9670 | 1.5010 |
| Q | Outcoupling exponent | 18.96 | 30.30 | 52.62 | 76.22 | 107.08 |
| K | Outcoupling scale factor | 1.0 | 1.0 | 1.0 | 1.0 | 1.0 |
| τpL, τpS | Photon lifetime | 3.54E-12 | 3.54E-12 | 3.54E-12 | 3.54E-12 | 3.54E-12 |

| Parameter | Description | Case6 | Case7 | Case8 | Case9 |
|---|---|---|---|---|---|
| Nt | Top mirror pairs | 17 | 17 | 17 | 17 |
| Nc | Center mirror pairs | 41 | 44 | 47 | 50 |
| Nb | Bottom mirror pairs | 20 | 20 | 20 | 20 |
| Γ0 | Conf factor intercept | 0.0245 | 0.0245 | 0.0245 | 0.0245 |
| dΓ/dn | Conf factor slope | 2.3300 | 3.6167 | 5.6141 | 8.7145 |
| Q | Outcoupling exponent | 146.61 | 196.31 | 257.85 | 333.02 |
| K | Outcoupling scale factor | 1.0 | 1.0 | 1.0 | 1.0 |
| τpL, τpS | Photon lifetime | 3.54E-12 | 3.54E-12 | 3.54E-12 | 3.54E-12 |

Figure 16.

| Parameter | Description | Value | Unit |
|---|---|---|---|
| g0 | Gain coefficient | 3.0E+03 | 1/cm |
| N0 | Unpumped gain fit parameter | 1.1E+18 | 1/cm3 |
| Ntr | Transparency carrier density | 2.6E+18 | 1/cm3 |
| taun | Carrier lifetime | 2.0E-09 | s |
| d2τp/dn2 | Photon lifetime (quadratic) | 0.0E+00 | s |
| dτp/dn | Photon lifetime (linear) | 0.0E+00 | s |
| τp0 | Photon lifetime (constant) | 3.54E-12 | s |
| β | Spont. emission factor | 2.0E-03 | |
| B | Bimolecular recomb rate | 1.20E-10 | cm3/s |
| Psat | Saturation photon density | 2.50E+16 | 1/cm3 |
| dn/dN | Differential refractive index | -1.20E-20 | cm-3 |
| ηi | Injection eff | 80 | % |
| next | Ext quantum efficiency | 50 | % |
| vg | Group velocity | 9.09E+09 | cm/s |
| Nqw | Number of QW's | 5 | |
| Zqw | QW thickness | 8.0E-07 | cm |
| r | Active radius | 2.5E-04 | cm |
| V | Active volume | 7.85E-13 | cm3 |
| hv | Photon energy | 2.339E-19 | Joule |

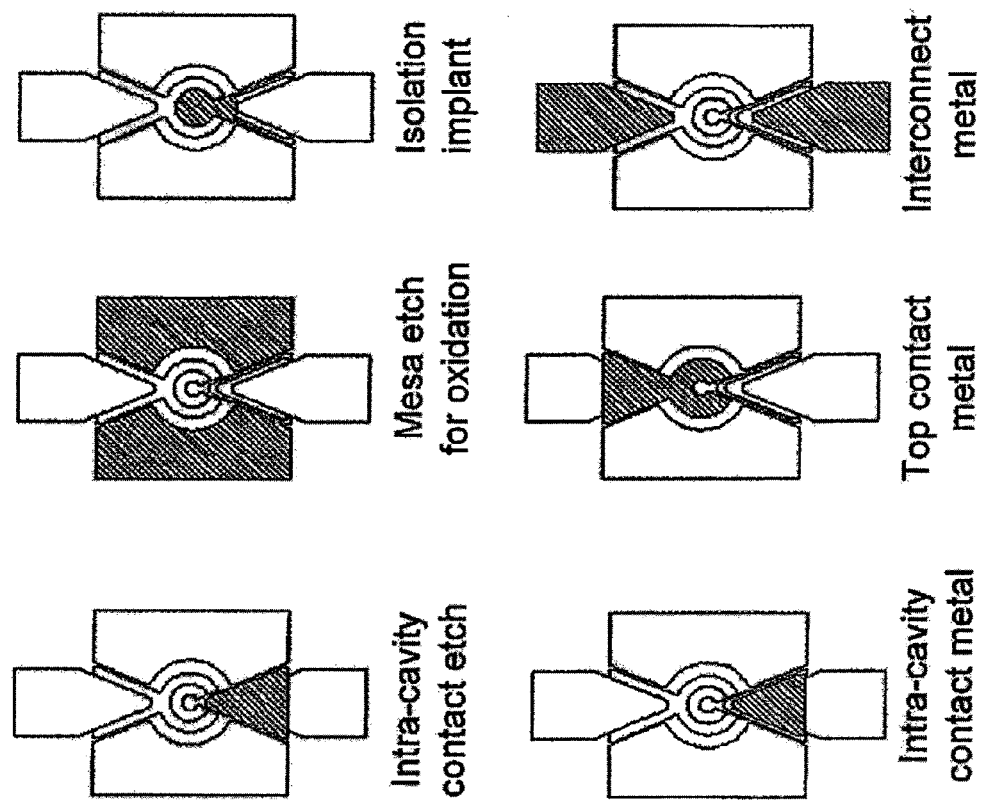

PUSH-PULL MODULATED COUPLED VERTICAL-CAVITY SURFACE-EMITTING LASERS AND METHOD

CROSS REFERENCE TO RELATED APPLICATIONS

This application is a continuation application of U.S. patent application Ser. No. 13/163,434, filed Jun. 17, 2011 and titled "PUSH-PULL MODULATED COUPLED VERTICAL-CAVITY SURFACE-EMITTING LASERS AND METHOD," which is a divisional application of U.S. patent application Ser. No. 12/710,156, filed Feb. 22, 2010 and titled "DIRECT MODULATED MODIFIED VERTICAL CAVITY SURFACE EMITTING LASERS," which claims the benefit under 35 U.S.C. §119(e) of Provisional Application No. 61/208,200 filed on Feb. 20, 2009 for "DIRECT MODULATED MODIFIED VERTICAL CAVITY SURFACE EMITTING LASERS," each of which is incorporated herein by reference in its entirety.

STATEMENT REGARDING FEDERALLY SPONSORED RESEARCH OR DEVELOPMENT

This invention was made with Government support under contract W31P4Q-07-C-0284 awarded by the U.S. Army. The Government has certain rights in the invention.

BACKGROUND

The present invention relates to a modulated intensity output solid state laser and, more particularly, to a modulated intensity output vertical cavity surface emitting solid state laser.

Large numbers of closely spaced lateral circuit interconnections, extending between various portions of individual integrated circuit chips, between various integrated circuit chips mounted on a printed circuit board, and between various printed circuit boards mounted in a system, that can each transmit large numbers of signal symbols with extreme rapidity are increasingly needed. These interconnections are needed to move, between selected locations, the large amounts of data generated by very fast signal processors that appear on signal busses for transmitting signal symbols representing such data, data that is to be received and sent by those processors and by various related data receiving, using, generating and transmitting devices.

As chip area and board mounted component density increases, the numbers of unavoidable, but unwanted, electrical circuit couplings, or parasitics, will most certainly increase substantially. Dynamic power dissipation in on-chip and off-chip circuits for operating circuit interconnections comprises the vast majority of total power consumed. Dynamic dissipation scales linearly with switching speed, and so power consumption per line in electrical interconnections can be expected to soon outstrip that of their optical interconnection counterparts where the power dissipation is essentially independent of signal path length over those interconnections. Hence, there will be transitions in the future to optical interconnection based system architectures.

These optical interconnection arrangements will require low cost, low power, directly modulated, high-reliability, single-chip laser sources and source arrays operating at data rates in excess of 17 Gbps, now, but capable of reaching 100 Gbps in the future, to meet the demands of existing, and emerging future, serial chip and board data communications requirements. Such required capabilities for the laser sources lead to difficult requirements to be met by those sources in terms of power dissipation, reliability, and interconnection spatial densities.

Single lasers and one dimensional and two-dimensional laser arrays are needed for fiber optic links, board-to-board and chi-to-chip links. Each laser should dissipate less than 2 to 5 mW/laser. Reliability must be greater than 100,000 hours (10 years) at a minimum. Device-to-device uniformity needs to be high (variations being less than 5%), and device aging characteristics must be sufficiently slow to eliminate any need for power monitoring. Low device lasing thresholds and high modulation efficiencies will be required to minimize electrical power drains in the laser driver arrays. In addition, in the case of intra-chip optical interconnects, thermal dissipations pose a particularly challenging problem as the components may be expected to operate at ambient temperatures in excess of 80 C. This not only will have a significant impact on device intrinsic bandwidth, but on device reliability as well.

Vertical cavity surface emitting lasers (VCSELs) have been found to be suitable laser sources for short transmission distance optical networks with 10 Gbps VCSELs being the laser devices with the largest modulation rates commercially available today. VCSELs thus are the dominant light emission source for short transmission distance optical interconnection arrangements and local area networks because of their large modulation rate capabilities, low power consumption, spatially dense device array integration, and low cost manufacturing of those devices when made in sufficiently large numbers.

VCSEL sources that are directly modulated to correspondingly vary the emitted light intensity at large modulation rates offer a substantial decrease in cost over the typical alternative, a CW laser operated in conjunction with an external adjacent electro-absorption modulator. An important figure of merit for modulation rates in lasers is the $-3$ dB small-signal modulation bandwidth that is defined as the point at which the modulated optical output, measured as a function of frequency, is reduced to half of its low modulation rate value. A variety of methods have been used to achieve greater modulation rates of light intensities emitted by VCSELs. These have included use of metal contacts on polymer layers as well as ion implantation to reduce device capacitance to achieve small-signal modulation bandwidths of 16 to 20 GHz. Although state-of-art VCSELs in laboratories have been demonstrated to provide modulation bandwidths of 40 Gbps, current VCSEL technology makes achieving modulation bandwidths greater than 10 Gbps in practice very difficult because of reduced device reliability if operated at the large current densities required to do so. Therefore, VCSELs that can be reliably operated with greater modulation bandwidths are desired.

SUMMARY

The present invention provides a laser system having separately electrically operable cavities for emitting modulated narrow linewidth light with the system having a compound semiconductor material substrate with at least two first mirror pairs of semiconductor material layers in a first mirror structure on the substrate of a first conductivity type and a first active region on that first mirror structure with plural quantum well structures. There is at least twenty second mirror pairs of semiconductor material layers in a second mirror structure on the first active region of a second conductivity type and a second active region on the second mirror structure with plural quantum well structures with at least two third mirror pairs of semiconductor material layers in a third mirror structure on the second active region of said first conductivity type. An intermediate electrical interconnection is provided at the second mirror structure and a pair of electrical interconnections are provided separated by the substrate, the first mirror structure, the first active region, the second mirror structure, the second active region, and the third mirror structure.

BRIEF DESCRIPTION OF THE DRAWINGS

FIG. 3b shows a graph displaying plots of responses of a composite resonator vertical cavity laser operated using current, electro-absorption and combined modulations with the electro-absorption and current modulation out of phase, FIG. 6 shows graphs displaying plots of responses of a composite resonator vertical cavity laser operated using push-pull modulation for (a) different values of small signal cavities currents amplitude difference A with currents phase difference $\theta=\pi$, and for (b) different values of small signal cavities currents phase difference $\theta$ with current amplitude difference A=1, FIG. 9 shows a diagrammatic cross section view of a structure arrangement for a composite resonator vertical cavity laser with associated field amplitude distributions designated $\lambda_S$ and $\lambda_L$ as the two longitudinal resonant modes of the combined cavities, FIG. 10 shows a table setting out an epitaxial layer structure for a composite resonator vertical cavity laser for emission at an example wavelength, FIG. 11 shows a table setting out typical material parameters for the device of FIG. 10, FIG. 15 shows a table setting out typical device alternative parameter selections for a composite resonator vertical cavity laser, FIG. 16 shows a table setting out further typical device parameters for a composite resonator vertical cavity laser, FIG. 24 shows an overlay of photolithographic mask layers used in fabrication of a composite resonator vertical cavity laser structure.

DETAILED DESCRIPTION

Figure 1:
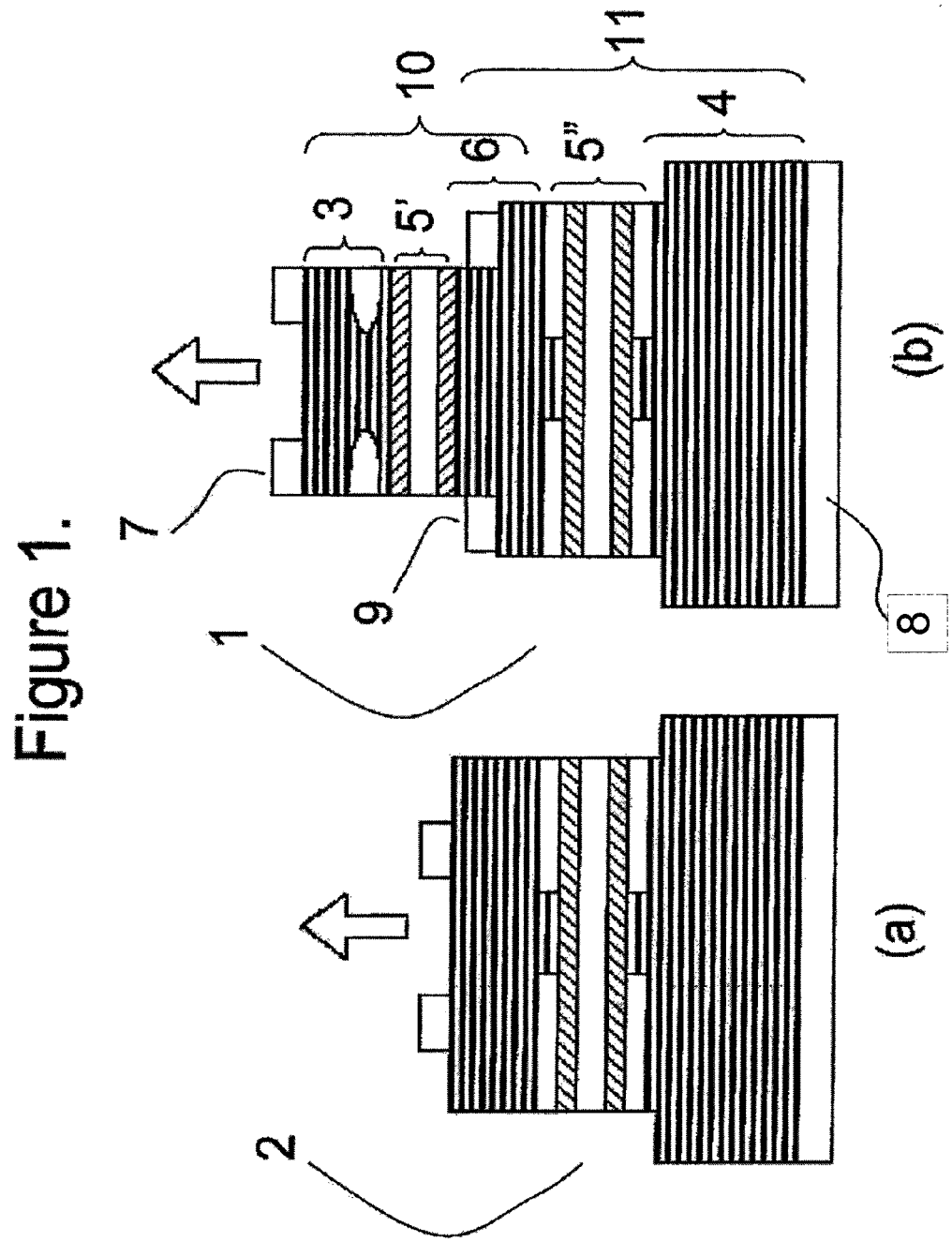
FIG. 1 shows (a) a diagrammatic cross section view of a structure arrangement for a vertical cavity surface emitting laser, and (b) a diagrammatic cross section view of a structure arrangement for a composite resonator vertical cavity laser.

A multiple resonant cavity vertical cavity surface emitting laser, 1, permitting very large rates of modulation in connection with the coupling between those cavities, is shown on the right in (b) of FIG. 1 in contrast to a conventional vertical cavity surface emitting laser (VCSEL), 2, shown on the left in (a) of FIG. 1. Multiple resonant cavity vertical cavity surface emitting laser 1, or composite resonator vertical cavity laser (CRVCL) 1, in (b) of FIG. 1 has two outer distributed Bragg reflector (DBR) mirrors, 3 and 4, (an upper outer mirror 3 and a lower outer mirror 4) and two multi-quantum well (MQW) active regions, 5' and 5", separated by an intermediate DBR mirror, 6, between the two outer mirrors. MQW active regions 5' and 5" constitute the p-n semiconductor junctions between upper mirror 3 and intermediate mirror 6, and bottom mirror 4 and intermediate mirror 6, respectively. The devices in FIG. 1 are formed as monolithic stacks of epitaxially grown layers that are subjected to subsequent fabrication process steps in completing those structures. The entire CRVCL structure can be grown in a single growth layer sequence and fabricated in semiconductor wafers in much the same way as conventional VCSEL 2 is fabricated. In FIG. 1, CRVCL 1 in (b) on the right is a three-terminal device with a terminal on each of the outer ends including an upper terminal, 7, and a lower terminal, 8, and an intermediate terminal, 9, on a mesa at the location of intermediate mirror 6 to thereby allow each active region between the mirrors to be independently biased or modulated, or both.

CRVCL 1 in this structure has the capability to change the photon density therein by varying the gain or absorption in an upper cavity, 10, comprising mirrors 3 and 6 along with active region 5' therebetween, or in a lower cavity, 11, comprising mirrors 4 and 6 along with active region 5" therebetween, while maintaining constant the current injection into the remaining other cavity (11 or 10, respectively), the further capability to detune an optical cavity by current injection, and the yet further capability to independently control carrier densities in both cavities to thereby aid in achieving very large intensity modulation rates. That is, the coupled cavities 10 and 11 in CRVCL 1, under appropriate biasing conditions, lead to an increase in the small-signal bandwidth.

Figure 2:
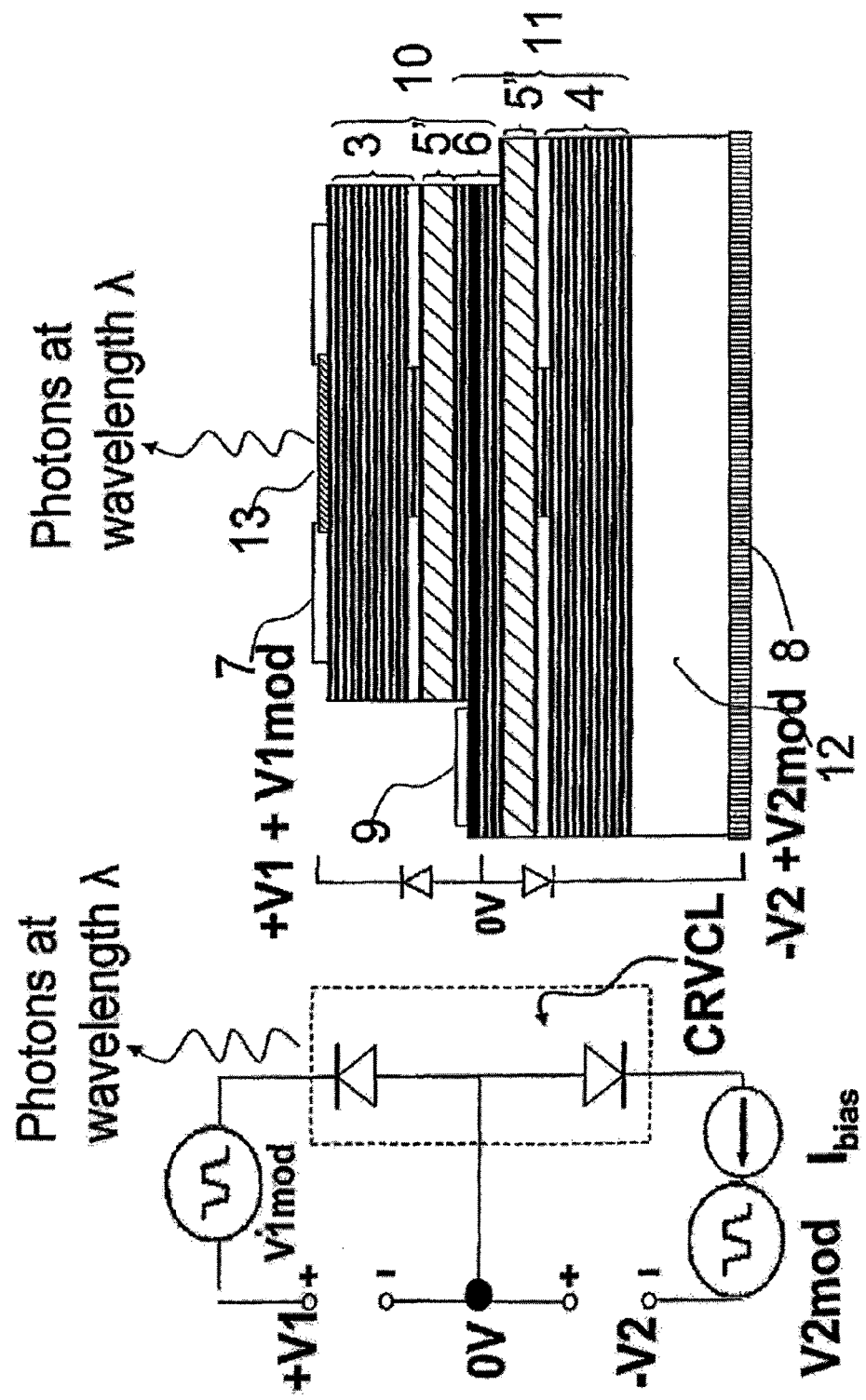
FIG. 2a shows a diagrammatic cross section view of a composite resonator vertical cavity laser in a circuit arrangement providing for combined current injection electro-absorption operation.
FIG. 2b shows a diagrammatic cross section view of a composite resonator vertical cavity laser in a circuit arrangement providing for push-pull operation.
Figure 2B:
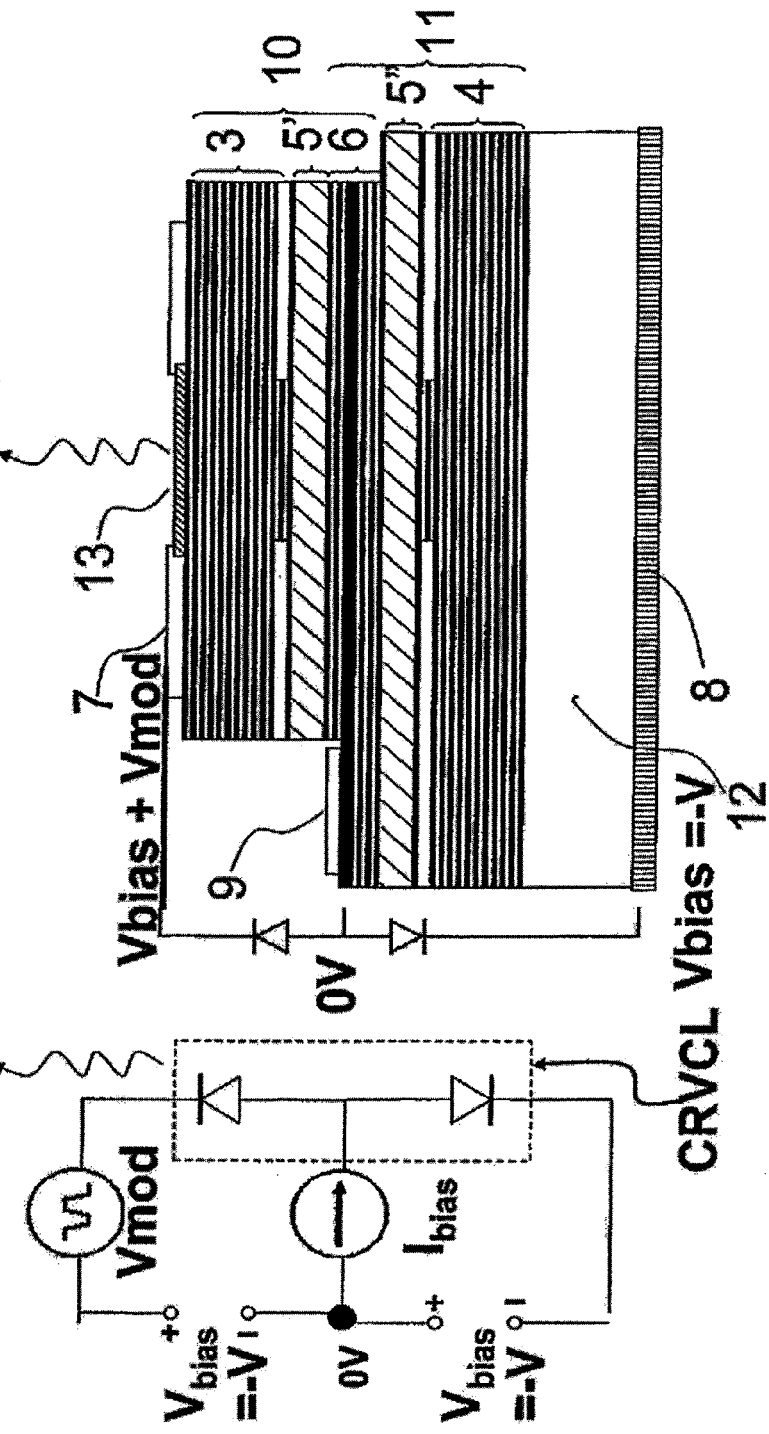

FIGS. 2(a) and 2(b) show a cross section of a slightly different CRVCL structure again having upper mirror 3, lower mirror 4, and intermediate mirror 6 as DBR mirror stacks, and two resonant cavities 10 and 11 containing the active regions 5' and 5", respectively, which can be independently provided with injection current, i.e. "pumped," or current biased or both. Two different modulation processes for a CRVCL structure, or device, are described below in which voltage waveforms of a voltage source as an input signal source are impressed on the intensity waveforms of the electromagnetic radiation emitted by the structure during operation thereof. They are designated 1) simultaneous current and electro-absorption modulation, or "combined modulation" illustrated in FIG. 2(a), and 2) push-pull modulation, illustrated in FIG. 2(b). In each modulation process description, a small-signal model based on rate-equation analysis is presented. In addition, a large-signal model is presented to show the large-signal response for the push-pull modulation process.

FIGS. 2(a) and 2(b) also show an equivalent circuit model for how the CRVCL structure would effectively behave as an electrical circuit component, and generally how such an effective circuit component would be provided in an electrical circuit to arrange for the desired kind of modulation to be applied to that structure as indicated above for each figure. These figures assume that the CRVCL structure would be grown with lower mirror 4 doped n-type, intermediate mirror 6 doped p-type, and upper mirror 3 doped n-type, thereby forming an n-p-n structure. However, the structure could also be grown p-n-p structure, with the upper and lower mirrors doped p-type, and the intermediate mirror doped n-type. In this latter situation, the operation algebraic sign of the applied voltages would be reversed, and the direction of current flows in the structure would also be reversed.

The modulating current in CRVCLs of FIG. 2 can be introduced into one of cavities 10 or 11 while the current injection into the remaining other cavity (11 or 10, respectively) is maintained constant, and this results in the modulation of the total carrier density, gain, and eventually the intensity of the electromagnetic radiation output of the laser. However, the magnitude of the relaxation oscillation frequency (ROF) due to interactions of carriers and photons upon changes in the modulating current limits the large signal modulation although steps can be taken to reduce this magnitude. Alternatively, means to decouple this interaction would lessen the relaxation oscillation effect to thereby provide increased modulation bandwidth.

In the first variant of the present invention, one cavity is forward biased, so that current is injected (in FIG. 2(a) active region 5" p-n junction in lower cavity 11 is shown forward biased by constant value current source $I_{bias}$). The modulated current density in the forward-biased active region 5" p-n junction can be modulated either in-phase or out-of-phase with the electro-absorption (EA) voltage modulation across the reverse biased remaining junction (shown in FIG. 2(a) as active region 5' p-n junction in upper cavity 11 being reverse bias by constant value voltage source V1). Thus, in the device of FIG. 2(a) we show the upper cavity active region 5' p-n junction as reverse biased, and the lower cavity active region 5" p-n junction as forward biased, but that device would function similarly if the lower cavity active region 5" p-n junction were reverse biased and upper cavity active region 5' p-n junction were forward biased. Variable voltage modulation signal sources $V1_{mod}$, in series with voltage source V1, and $V2_{mod}$, in series with current source $I_{bias}$, may or may not have equal voltage values. The modulating voltage $V2_{mod}$ on the forward biased junction results in a modulation of the current flow $I_{mod}$ through the junction such that the total current $I_{total} = I_{bias} + I_{mod}$.

The push-pull operating mode is illustrated in FIG. 2(b). In this arrangement, where the resonator is balanced, large rate resonance-free modulation is possible for a single longitudinal mode due to carrier-induced index modulation of the output coupling efficiency. In this case both active region 5' and 5" p-n junctions are forward biased. A current source in each loop of the circuit maintains a constant total current in that loop, $I_{bias}/2$, and together, a constant total current into the device, $I_{bias}$. A modulation voltage is added to one or the other junctions (in FIG. 2(b) shown to be in series with upper active region 5' p-n junction) which results in a current modulation of $I_{mod}$. The result is a current flow of $I_{bias}/2 + I_{mod}$ in the upper active region 5' p-n junction, and a current modulation of $I_{bias}/2 - I_{mod}$ in the lower active region 5" p-n junction. In either variant illustrated by FIGS. 2(a) and 2(b), the relaxation oscillation behavior can be significantly modified to result in greater bandwidth.

In analyzing the small-signal response of a CRVCL under the first modulation process, combined current and electro-absorption modulation, a modified rate-equation model is used with two carrier populations and a single longitudinal mode to describe the modulation response. The assumption of a single longitudinal mode simplifies the rate equations, and is also appropriate for much of the operating range of the CRVCLs considered. Unlike the conventional modulation of a laser in which a small-signal is introduced through current modulation, the CRVCL undergoes the modulation of absorption loss through application of a reverse bias voltage to one of its cavities.

The rate equations for carrier and photon densities for current/electro-absorption modulation are derived by assuming only one optical mode is lasing, or $$\frac{dN_1}{dt} = \frac{J}{qd} - \frac{N_1}{\tau_1} - vg\xi_1 S \tag{1}$$

$$\frac{dN_2}{dt} = \frac{N_2}{\tau_2} + \eta_d \xi_2 S \tag{2}$$

$$\frac{dS}{dt} = \left(\Gamma vg\xi_1 - \frac{\xi_2}{\tau_p}\right)S + \beta R_{sp} \tag{3}$$

where $N_1$ and $N_2$ are the carrier densities in the two active regions (5' and 5") (1/cm$^3$), $\tau_1$ and $\tau_2$ are the carrier lifetimes in the current modulation cavity (10 or 11) and electro-absorption modulation cavity (11 or 10), respectively, J is the injection current density (A/cm$^2$), q is the elementary charge (C), d is the gain region thickness (cm), v is the group velocity of the optical mode in the material (cm/s), g is the material gain (cm$^{-1}$), $\Gamma$ is the optical confinement factor in the forward-biased cavity, $\tau_{1p}$ is the photon lifetime, S is the photon density (1/cm$^3$), $\beta$ is the spontaneous emission factor, and $R_{Sp}$ is the spontaneous emission rate per unit volume (1/cm$^3$s). The quantities $\xi_1$ and $\xi_2$ represent the fraction of the optical standing wave overlapping with the current modulation cavity 10 or 11 and electro-absorption cavity 11 or 10, respectively. The electro-absorption modulation cavity 11 or 10 under reverse-bias behaves as a photodetector which converts the light emission from the current modulation cavity 10 or 11 into a photocurrent in the electro-absorption modulation cavity 11 or 10. This process is accounted by assuming the photodetector efficiency $\eta_d$ in equation (2).

As evident in equation (4), the total response of the device under both current and electro-absorption modulation can be considered as a superposition of the response under conventional current modulation and electro-absorption modulation separately. If the electro-absorption modulation is removed, i.e. m=0, the total response will become that of a conventional laser under direct current modulation, $$\left|\frac{s(\omega)}{S_0}\right| = \left|\frac{\Gamma \tau_p \omega_r^2 j(\omega)}{qdS_0 D(\omega)}\right| \tag{6}$$

On the other hand, if the current modulation is removed by setting j($\omega$)=0, then the total response will be in the same form as the laser response under the electro-absorption modulation, $$\left|\frac{s(\omega)}{S_0}\right| = \left|\left(\xi_2 \frac{m}{\tau_p}\left(-i\omega + \frac{1}{\tau} + vg'S_0\right)\right)/D(\omega)\right|. \tag{7}$$

Figure 3A:
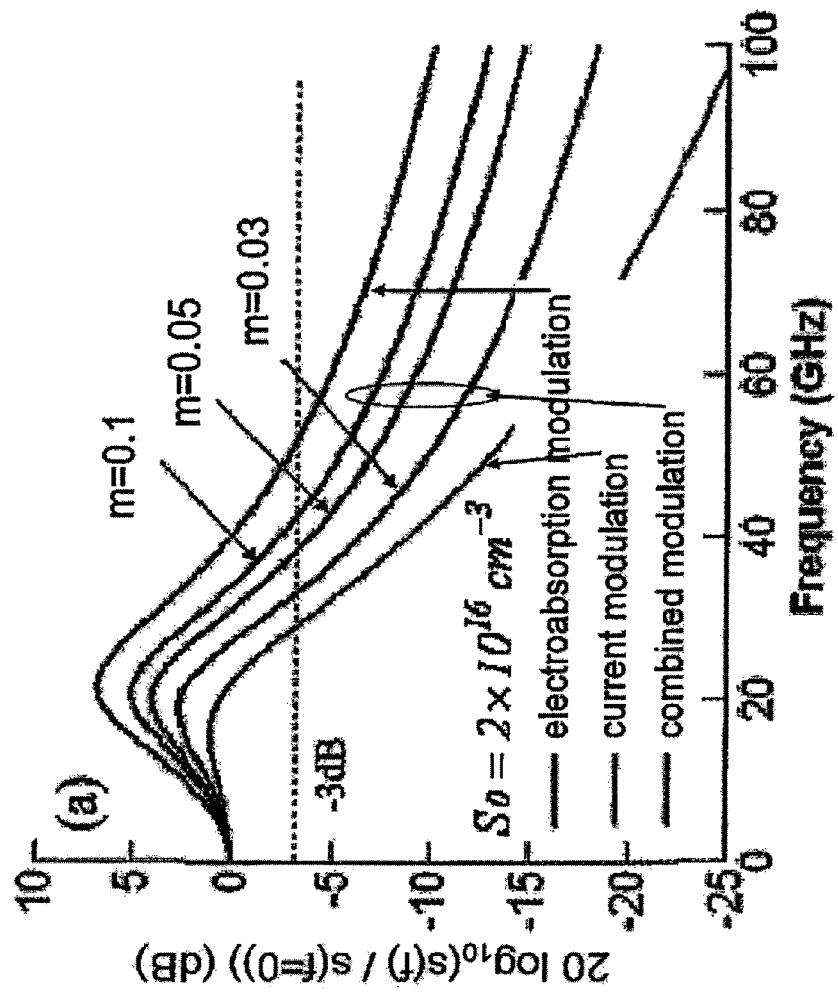
FIG. 3a shows a graph displaying plots of responses of a composite resonator vertical cavity laser operated using current, electro-absorption and combined modulations with the electro-absorption and current modulation in-phase.

Comparing equations (6) and (7), the direct current modulation produces a relatively flat modulation response yet with somewhat limited 3-dB bandwidth, while the electro-absorption modulation produces the opposite. As illustrated in FIG. 3(a), combining both the modulation components in-phase enables a new design freedom, so that a tradeoff between a flat response (a small relaxation oscillation peak) and high modulation bandwidth can be made for an improved bandwidth. Moreover, another option is to combine both the modulation components out-of-phase such that the overall modulation bandwidth can be enhanced as shown in FIG. 3(b). This works better when the current and electro-absorption modulation are relatively flat by themselves. The electro-absorption modulation index m can be employed to tailor the combined modulation response. By combining current and electro-absorption modulation out-of-phase, a relatively flat response with a 3 dB modulation bandwidth of ~90 GHz can be achieved (neglecting electrical parasitics).

Figure 4:
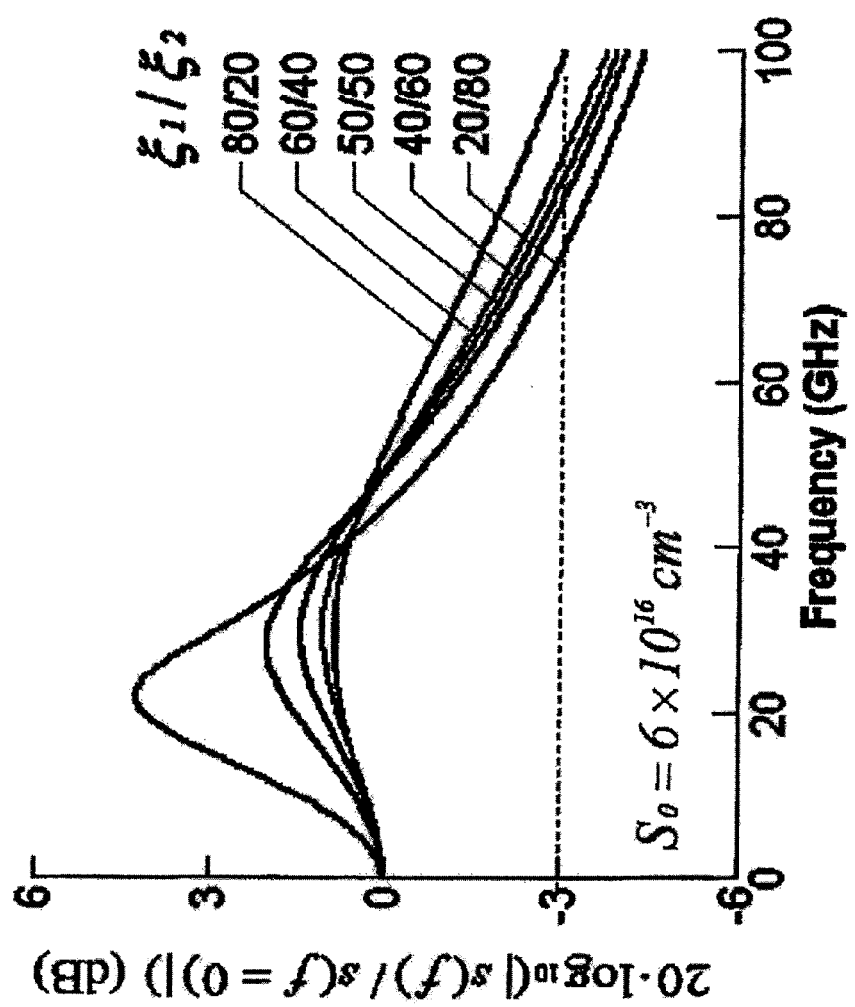
FIG. 4 shows a graph displaying plots of responses of a composite resonator vertical cavity laser operated using combined modulation with different optical standing wave overlap ratios, $\xi1/\xi2$.

Such a CRVCL allows detuning the cavity 10 and 11 lengths to permit each cavity to have a different optical standing-wave overlaps $\iota_1$ and $\xi_2$. FIG. 4 illustrates the combined modulation response at a fixed photon density $S_0$, while the relative overlap of the longitudinal mode with each cavity is varied. As evident from the figure, the cavity detuning is another design freedom to produce an improved modulation response, indicating that a 100 GHz 3-dB bandwidth and only ~1 dB relaxation oscillation peak can be achieved with an 80/20 distribution of the longitudinal mode overlap between the two cavities. The current injection and voltage modulation create some of this detuning, but it can also be built into the structure by growing the two cavities with different cavity lengths, i.e. adjusting the thickness of active region 5' relative to active region 5".

The second modulation process of a CRVCL, push-pull modulation, provides another means to decouple the photon density and current density and minimize the relaxation oscillation effect. For push-pull modulation, the forward-bias injection current through both the top 10 and bottom 11 cavities of a CRVCL will be modulated simultaneously but maintained out-of-phase. As the carrier density increases in one cavity, the carrier density in the other cavity decreases by an equal amount, maintaining a constant total carrier population. Hence, the net photon population essentially decouples from changes in carrier population, which results in the elimination of the relaxation oscillation peak.

Without losing generality, we will analyze a CRVCL in which both the upper 10 (output) and lower 11 cavities are current modulated. This is an extension of the analysis for the current modulation in one cavity. Assuming that only one optical mode is lasing, the rate equations can be written as:

$$\frac{dN_1}{dt} = \frac{J_1}{qd} - \frac{N_1}{\tau_1} - vg_1\xi_1 S \tag{8}$$

$$\frac{dN_2}{dt} = \frac{J_2}{qd} - \frac{N_2}{\tau_2} - vg_2\xi_2 S \tag{9}$$

$$\frac{dS}{dt} = \left(\Gamma_1 vg_1\xi_1 + \Gamma_2 vg_2\xi_2 - \frac{1}{\tau_p}\right)S + \beta R_{sp} \tag{10}$$

where for cavity m, $N_m$ is the carrier density (1/cm$^3$), $J_m$ is the injection current density (A/cm$^2$), $\tau_m$ is the carrier lifetime (s), $g_m$ is the material gain (cm$^{-1}$), $\Gamma_m$ is the optical confinement factor, and the other parameters are defined the same as in equations (1) through (3).

The push-pull modulation response can be obtained by solving the rate-equations (8) through (10), yielding $$\left|\frac{s(\omega)}{S_0}\right| = \left| \frac{\Gamma_1 vg_1'\left(\frac{j_1(\omega)}{qd} - vg_{10}S_0\xi_1(\omega)\right) + \Gamma_2 vg_2'\left(\frac{j_2(\omega)}{qd} - vg_{20}S_0\xi_2(\omega)\right) \cdot \frac{i\omega - \left(\frac{1}{\tau_1} + vg_1'\xi_{10}S_0\right)}{i\omega - \left(\frac{1}{\tau_2} + vg_2'\xi_{20}S_0\right)}}{\omega^2 + i\omega\left(\frac{1}{\tau_1} + vg_1'\xi_{10}S_0\right) - v^2\Gamma_1\xi_{10}g_{10}g_1'S_0 - v^2\Gamma_2\xi_{20}g_{20}g_2'S_0 \cdot \frac{i\omega - \left(\frac{1}{\tau_1} + vg_1'\xi_{10}S_0\right)}{i\omega - \left(\frac{1}{\tau_2} + vg_2'\xi_{20}S_0\right)}} \right| \quad (11)$$

where for cavity m, $g_{m0}$ is the steady-state material gain (1/cm), $g_m'$ is the differential gain (1/cm²), and $\xi_{m0}$ is the percentage of standing-wave overlap under steady-state. However, by assuming identical cavity conditions, equation (11) can be simplified to:

$$|H(\omega)| = \left|\frac{s(\omega)}{j_1(\omega)}\right| = \left|\frac{\frac{\omega_r^2 \Gamma \tau_p}{qd} \cdot (1 + Ae^{j\theta})}{[(\omega^2 - \omega_r^2)^2 + \omega^2\gamma^2]^{\frac{1}{2}}}\right| \quad (12)$$

where A and θ account for the phase and amplitude difference between the small-signal current components such that $$j_2(\omega) = A \cdot j_1(\omega) \cdot e^{j\theta} \quad (13).$$

The response given by the equation (12) is similar to the modulation response of a conventional laser, with additional dependence on A and θ.

In push-pull modulation, the external observability of the modulation response of the two cavities must be determined, i.e. whether external light modulation occurs which can be used to carry information. Therefore push-pull modulation requires additional analysis to understand the effects on the longitudinal modes.

Figure 5A:
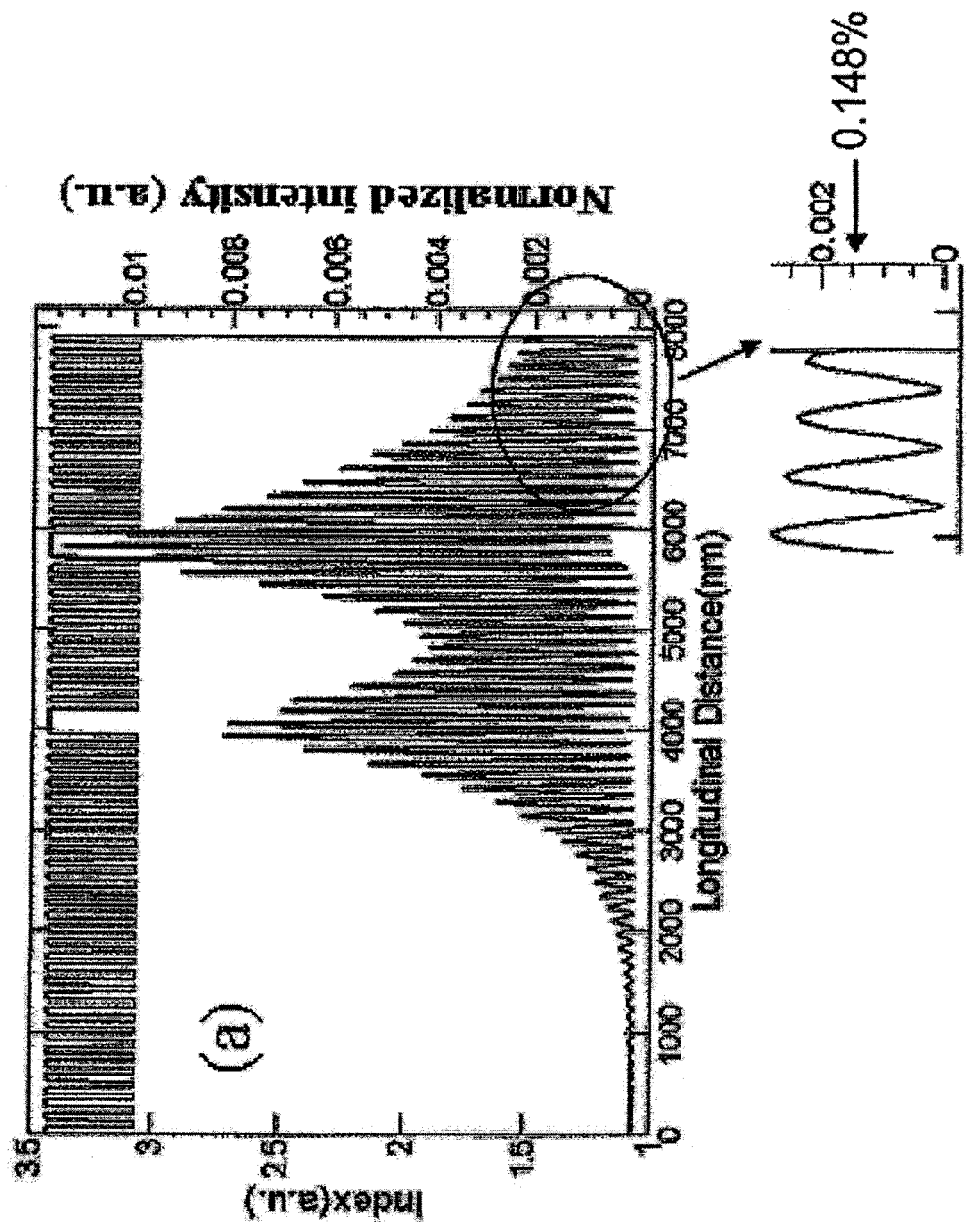
FIG. 5 shows graphs displaying plots of refractive index and normalized optical field intensity profiles for the short optical length cavity of a composite resonator vertical cavity laser along the longitudinal direction thereof if (a) the top cavity is shorter than the bottom cavity, and if (b) the top cavity is longer than the bottom cavity with each graph having an inset thereby showing the optical field intensity near the laser facet and the percentage of light at that facet.
Figure 5B:
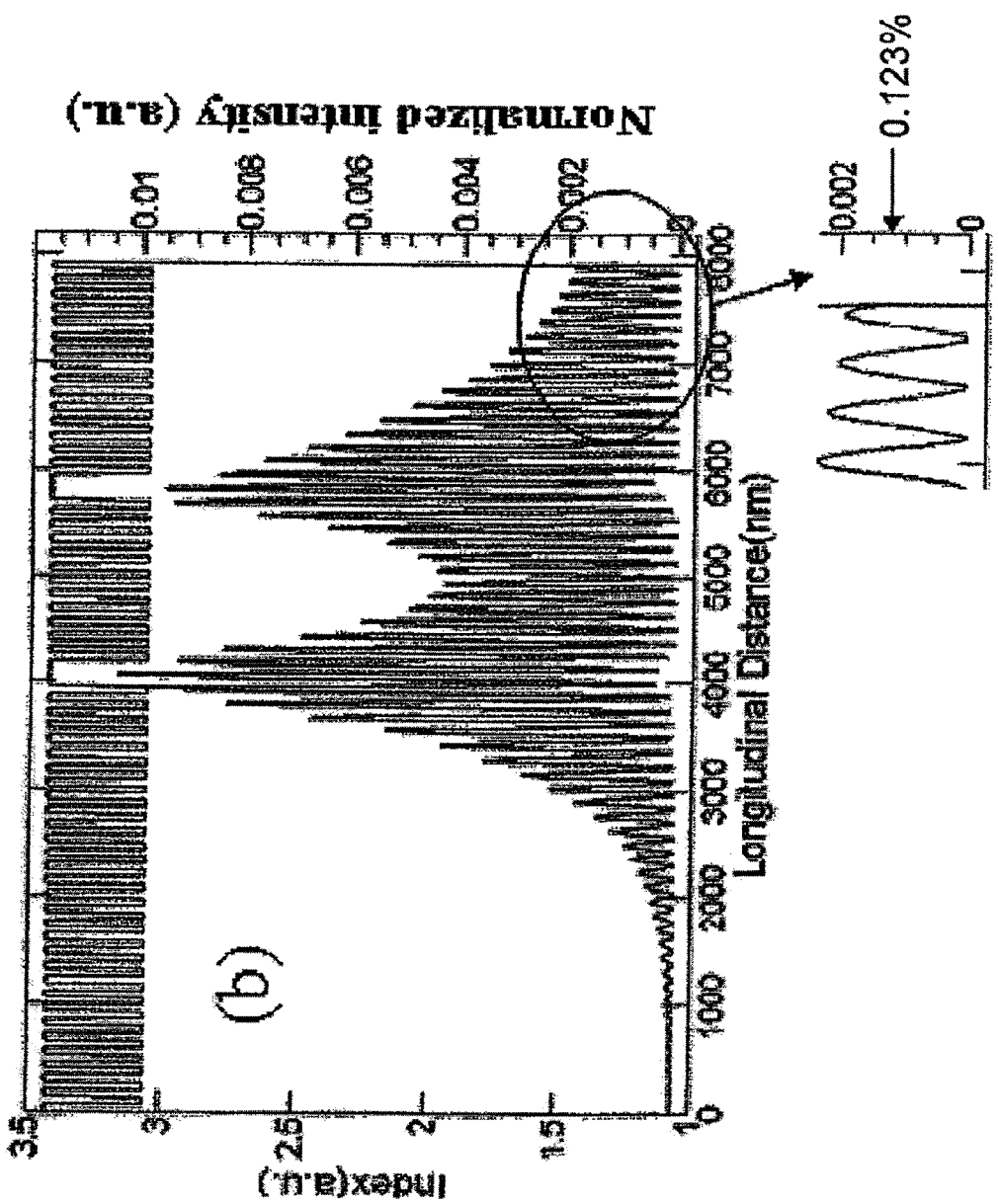

Longitudinal mode modulation arises from the dynamic cavity detuning under the (differential) current injection through both cavities 10 and 11, leading to a change in the relative coupling efficiencies of the top 3 and bottom 4 mirrors. Under the condition of A=1 and θ=π, in push-pull modulation, the carrier density always increases in one cavity 10 or 11 while it decreases in the remaining other cavity 11 or 10, respectively. Owing to the carrier-induced index change, the effective length for one cavity will decrease, while for the other cavity the length will increase. As a result, the optical mode will be either "pushed" towards the CRVCL substrate 12 producing less output light, or "pulled" towards the output facet 13 producing more output light as indicated in FIG. 5. All this occurs while the photon lifetime and hence the total photon population remains unchanged, i.e. the total number of photons exiting the cavity through the top 3 and bottom 4 mirrors remains constant. Since the longitudinal mode modulation is not natively included in the rate equation analysis, it has to be accounted for separately.

The longitudinal mode modulation is assumed to be 10% of the available light at the output facet. This assumption will be justified later. The equation (12) is modified to account for the longitudinal mode modulation by adding an additional term:

$$|s_{out}(\omega)| = \left|\frac{j_1(\omega) \cdot \frac{\omega_r^2 \Gamma \tau_p}{qd} \cdot (1 + Ae^{j\theta})}{[(\omega^2 - \omega_r^2)^2 + \omega^2\gamma^2]^{\frac{1}{2}}} \cdot 0.15\% + 10\% \cdot 0.15\% \cdot S_0\right| \quad (14)$$

where $s_{out}(\omega)$ is the small-signal photon density at the laser facet. The factor 0.15% represents the percentage of the total internal intensity present at the output laser facet under steady-state conditions.

FIG. 6 is plotted to illustrate the frequency dependence of the push-pull modulation response and the dependence thereof on A and θ. As indicated in the figure, an extraordinarily wide and flat modulation bandwidth (>80 GHz) is possible under the push-pull modulation scheme, and the behavior is markedly different than the equivalent structure under "normal" direct current modulation. The most pronounced feature is that the relaxation oscillation vanishes for A=1 and θ=π (black curves), which corresponds to the small-signal current for both cavities having the same amplitude and being exactly out of phase. The modulation bandwidth is therefore limited only by the photon lifetime, if electrical parasitic effects are neglected. As can also be seen in the figure, the modulation response is reasonably tolerant to deviations from the ideal push-pull modulation condition A=1 and θ=π, which makes the operation of the device tolerant to manufacturing variations.

The calculations so far assume the identical top 10 and bottom 11 optical cavities. However, it can be expected that this may be difficult to achieve in practice. For example, different current densities $J_{10}$ and $J_{20}$ would likely result in different values of $\xi_1/\xi_2$, $g_1'/g_2'$ and $g_{10}/g_{20}$. Therefore, the full form of the modulation response given by equation (11) was invoked with the inclusion of the longitudinal mode modulation terms. It was found that the modulation response digresses from the ideal condition only slightly for a relatively large change in $\xi_1/\xi_2$, suggesting that a substantial fabrication tolerance exists.

Figure 7:
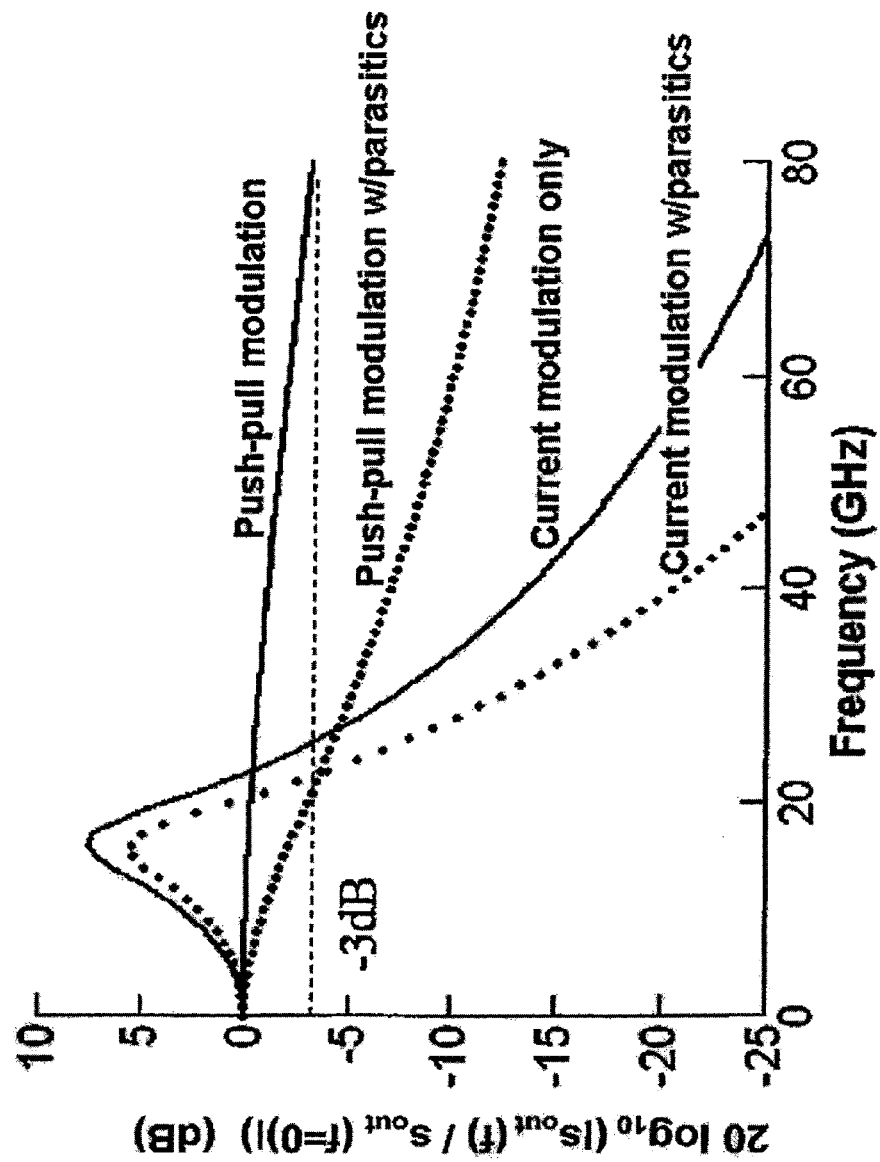
FIG. 7 shows a graph displaying plots of responses of a composite resonator vertical cavity laser operated using push-pull modulation with and without various device electrical equivalent parasitics, and plots of responses of effectively a vertical cavity surface emitting laser using standard current modulation with and without various device electrical equivalent parasitics.

Currently, intrinsic laser bandwidth and reliability at high current densities have been the modulation rate limiting factors in commercially available VCSEL-based transceivers, which generally operate at 10 Gb/s and below. Accordingly, at such frequencies, there is little need to be concerned about minimization of electrical parasitics affecting devices used therein. Of course, such parasitics are a fact of life and cannot simply be ignored, certainly not at larger frequencies. FIG. 7 illustrates the modeled push-pull modulation response of a CRVCL when both the upper 10 and lower 11 cavities are limited to 20 GHz electrical bandwidth, typically encountered in commercial devices, due to such parasitics as diode forward resistance, diode junction capacitance, and interconnection capacitances. The electrical parasitics introduce a dominant pole to the push-pull modulation response, and thus dominate the overall modulation bandwidth.

Therefore, the improvements in intrinsic laser bandwidth afforded by push-pull modulation of the coupled cavities in a CRVCL device can only be taken advantage of in conjunction with a reduction in device parasitics. By far, the dominant parasitic element in VCSELs is the device contact bonding pad capacitance $C_{bp}$, which together with the differential series resistance $R_d$ of the diode form a low pass filter with a cutoff frequency $f_c = 1/2\pi R_d C_{bp}$. The contact bonding pad is the metal area connected to terminals 7 and 9 which allow the device to be connected to the outside world, such as a driver IC, by a bond wire or solder bump between the bonding pad and the IC. A capacitance is associated with the interface between this bonding pad metal and the semiconductor underneath. There is definitely something to be gained from minimizing the series resistance, but given the current advanced state-of-the-art in DBR design, it is probably not realistic to expect results significantly better than what is commonly achieved today. This is to say that $R_d$ will almost certainly be in the range of 50 to 100 ohms for the 5 to 10 micron oxide aperture devices envisioned.

Figure 8:
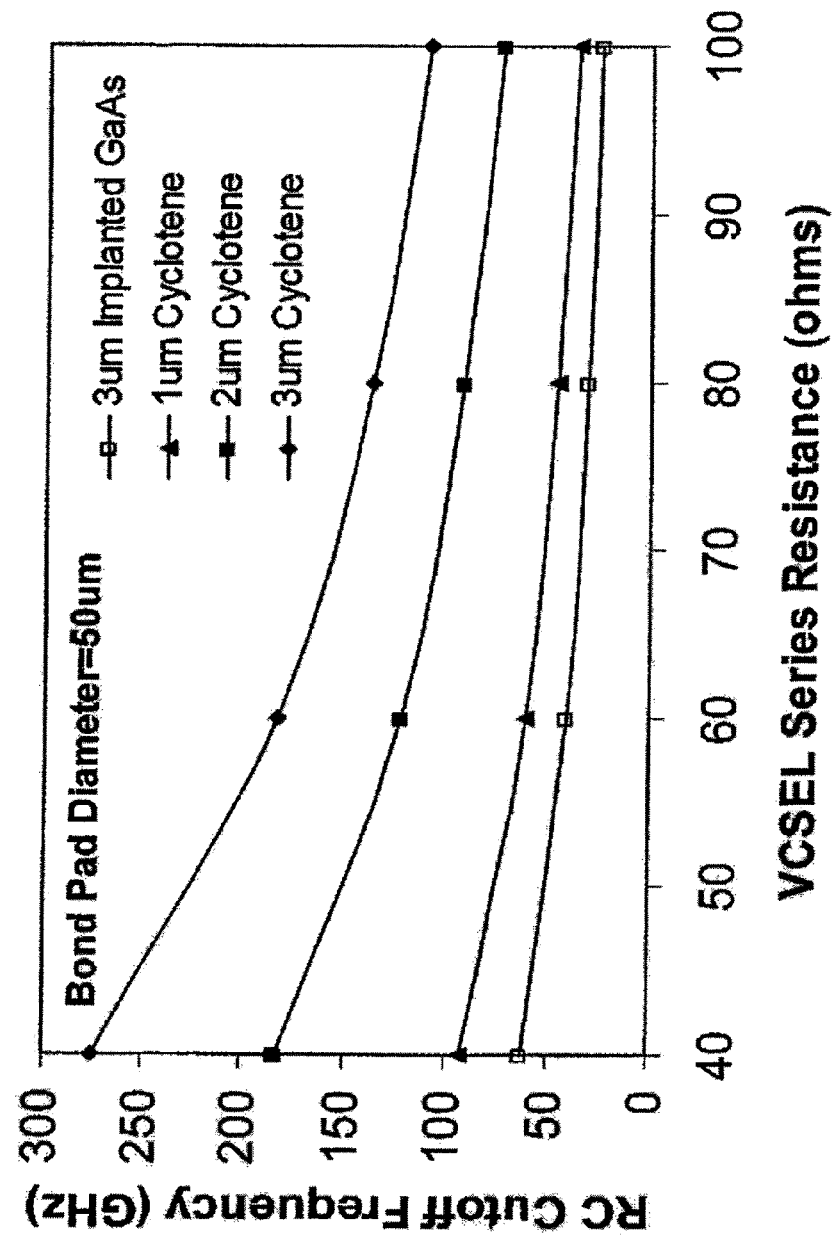
FIG. 8a shows a graph displaying plots of responses of a vertical cavity surface emitting laser bonding pad interconnection cutoff frequency $f_c$ resulting from interconnection parasitic capacitance as a function of the laser series resistance at the interconnection for an interconnection effected with 50 μm bonding pads supported on implanted GaAs or on various dielectric thicknesses over implanted GaAs.
FIG. 8b shows a diagrammatic cross section view of a structure arrangement for such interconnection alternatives.
Figure 8B:
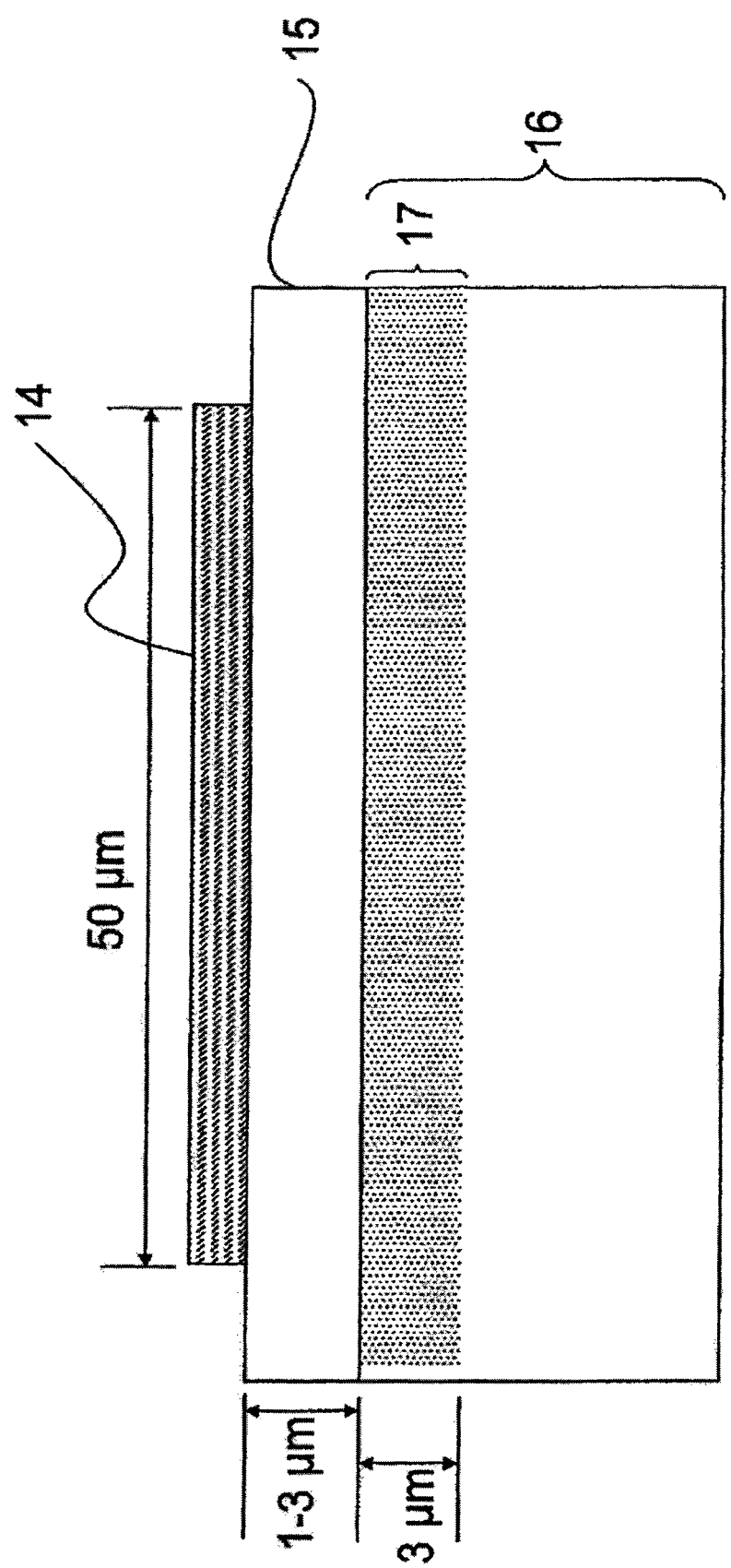

FIG. 8(a) shows a plot of $f_c$ vs $R_d$ for the structure illustrated in FIG. 8(b). The structure in FIG. 8(b) shows a bonding pad 14 which has a linear dimension of 50 μm, on top of a 1 to 3 μm thick Cyclotene™ dielectric layer 15, which in turn is on top of GaAs 16 which has an implanted region 17 that extends to a depth of 3 μm from the top surface of the GaAs. 50 μm is used as it is the smallest diameter bonding pad that can practically be used for a high manufacturing yield. As can be seen in FIG. 8(a), the incremental gain in going from 80 ohms to 60 ohms is relatively mirror when compared to the advantage of putting the pad metal on thick dielectric. This is as opposed to putting it directly on the implanted GaAs, as is commonly done. The data shows that even for the limiting case of a 100 ohm device, $f_c$>70 GHz can be obtained by putting the bonding pads on as little as 2 μm of Cyclotene (BCB).

The foregoing analyses have illustrated the small-signal modulation response of the CRVCL. However, use in communication systems requires modulation using large amplitude signals. Therefore, we will describe specific structures, and the large-signal response of these structures. FIG. 9 shows a schematic cross-section of the resonant structure of the coupled cavities in a suitable CRVCL, and FIG. 10 shows the detailed structure for a device as implemented to emit at a wavelength of 850 nm. However, the CRVCL structure can be implemented to emit at any wavelength that a more conventional structure emits at, ranging from UV (350 nm) to the IR (2500 nm). In the following description we assume the notation $Al_xGa_{1-x}As$ where x defines the relative content of aluminum to gallium in any given layer. For instance, x=1 refers to AlAs and x=0 refers to GaAs. For simplicity, we will drop the subscripts in the following description and refer to the value of x to describe the composition. We will also refer to some thicknesses in terms of optical thicknesses λ of the emission wavelength. For instance, for a device emitting at 850 nm, a 1λ optical thickness cavity in AlGaAs materials will be approximately 235 nm in physical thickness, since the refractive index n is approximately 3.6.

As shown in FIGS. 9 and 10, the resonator consists of a lower DBR stack 4 with Nb periods of alternating low index 18 and high index 19 quarter-wavelength thick layers with composition graded layers 20 between the low and high index layers, an intermediate central DBR 6 with Nc periods, and an upper top DBR 3 with Nt periods. The high index 19 and low index 18 materials in the DBRs consist of x=0.15 and x=0.95 to 1.0 AlGaAs respectively. These compositions are chosen to provide the maximum refractive index contrast, while avoiding compositions that would absorb the emitted light. Clearly, other compositions could be chosen as well. The nominal x=0.15 composition could range from x=0.05 to x=0.30, while the nominal x=0.95 AlGaAs could range from x=0.80 to 0.97 for an oxide current aperture, or to x=1.0 for current confinement provided by proton implantation or the etching of a mesa. For emission at other wavelengths, similar considerations would guide the choice of composition for the mirrors. Linearly graded interfaces 20 are used to reduce electrical series resistance. The grade could range to thicknesses as large as 200 nm.

At the interfaces between the mirrors are two active regions 5' and 5" with each cavity total optical thickness equal to 1λ when cold, each containing two symmetric 65% AlGaAs spacer layers 21 and five 7 nm thick GaAs quantum wells 22 with eight barriers with x=0.25 separating and surrounding the quantum wells 23. The number of quantum wells could be as few as one, and as many as 7. Quantum well thickness could also vary from 5 nm to 10 nm, and the barrier layer thickness could also vary. Space layer compositions could vary from 30% to 70%. The substrate 12 is formed of GaAs. FIG. 11 lists the material parameters.

Some additional layers are included in the structure to provide control over the current flow through the device. Included in the intermediate mirror 6 are two regions designated as oxidation structures 24. The x=0.98 layer 32 is partially oxidixed later in the process to confine the current to the center of the device. Other layers around the x=0.98 layer are lower Al content x=0.97 (33) and x=0.65 (34) and are designed to help control the thickness of the oxidation layer. Contact layers 25 at the top surface include a GaAs and AlGaAs layer with x=0.15 that are heavily doped to provide a low resistance contact to metals deposited on the top surface. The stop etch layer 26 and contact layer 27 are used to provide the metal contact for terminal 9 that contacts the intermediate mirror. The stop etch layer 26 is designed to be very slow etching so that a mesa can be etched down to this layer and stopped accurately. The contact layer 27 below it is more heavily doped and lower aluminum content so that we can make a low resistance contact to the structure.

Being a coupled-cavity resonator, the structure of FIG. 9 supports two longitudinal resonant modes, denoted $\lambda_L$ and $\lambda_S$, where $\lambda_L=\lambda_0+\Delta\lambda$ and $\lambda_S=\lambda_0-\Delta\lambda$. The splitting of the resonant wavelengths is strictly determined by the number of periods $N_c$ in the intermediate mirror 6. As $N_c$ is increased, the two cavities 10 and 11 become increasingly decoupled and the two modes tend towards degeneracy.

Figure 12:
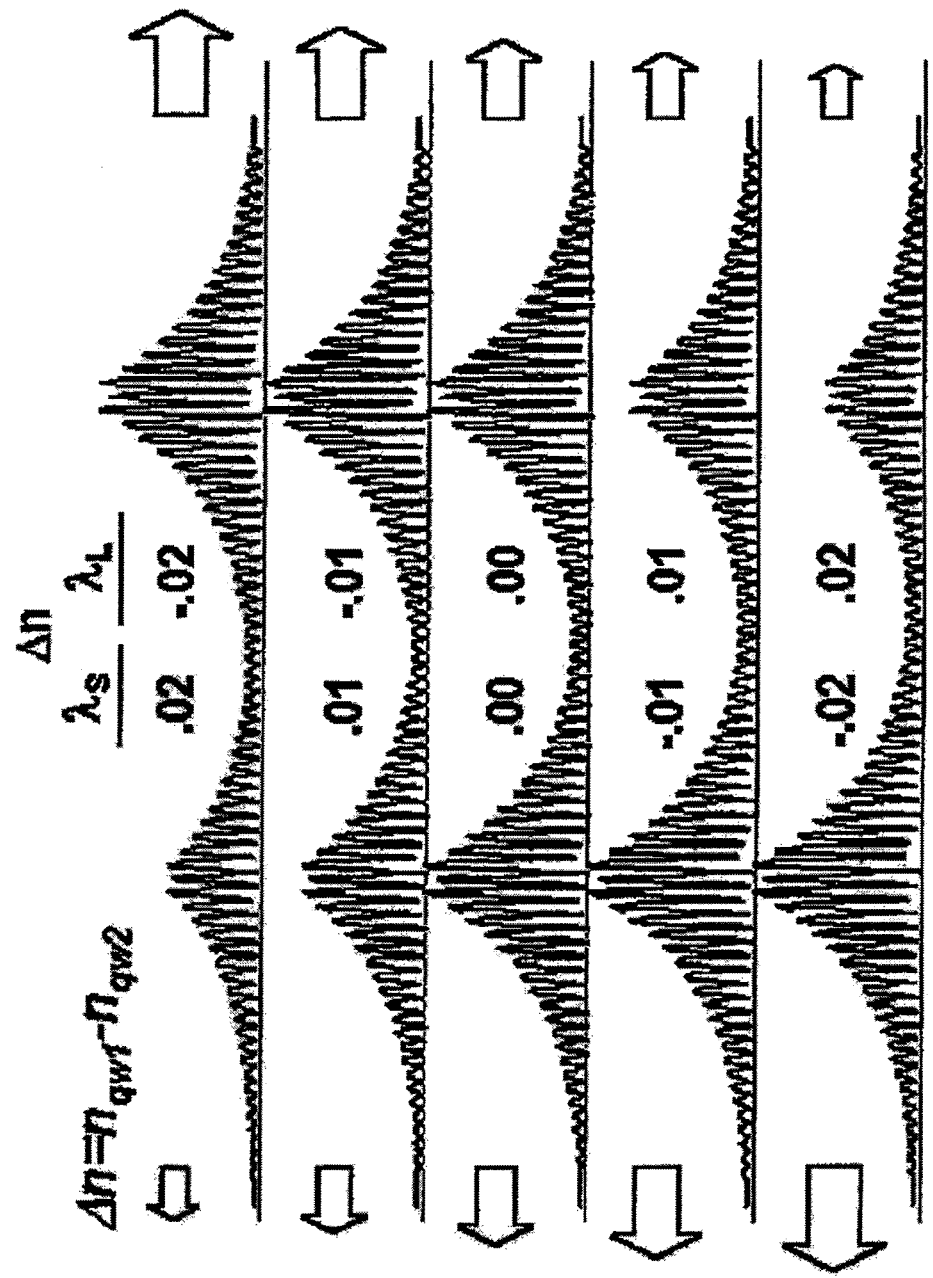
FIG. 12 shows plots of long and short wavelength field amplitude distributions versus relative cavity quantum well refractive indices.

As shown in FIG. 12, each mode is further characterized by its electric field distribution within the composite cavity. Characteristic of this type of structure, asymmetry of the field profiles is only manifest in the presence of a difference in the optical path lengths of the MQW active regions 5' and 5", regardless of the degree of coupling between the two cavities. For identical cavities, the field profiles are symmetric and degenerate for the two modes, i.e. the spatial distributions are equally split between the two cavities. As the ratio of the relative optical thicknesses of the two active regions 5' and 5" departs from unity, the peak modal e-field intensities migrate to one or the other cavity.

Figure 13:
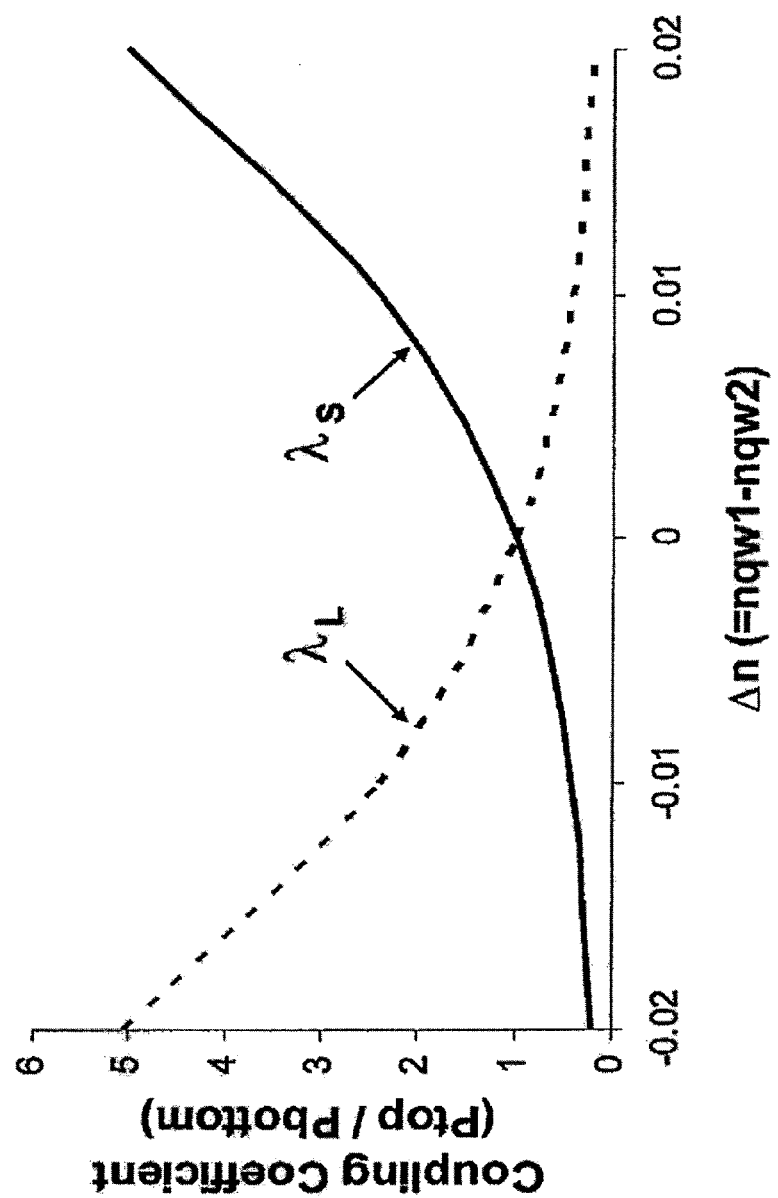
FIG. 13 shows a graph displaying plots of output coupling efficiencies of long and short modes versus relative cavity quantum well refractive indices.

Under cold (unpumped) conditions, the two optical cavities 10 and 11 are identical by design Δn=0 in the figure). Any change in the relative refractive indices of the quantum wells 22 ($\Delta n=n_{qw1}-n_{qw2}$) will cause the relative optical thicknesses to change. In addition, the long and short mode field profiles behave in opposite respect. For example, as the optical path length of the active layer 5" is decreased with respect to that of the upper active layer 5', the peak field intensity of the short wavelength mode shifts to the lower cavity 11 while that of the long wavelength mode shifts to the upper cavity 10. As the modal field distributions change, so too does the relative efficiency with which the individual modes couple out of the resonator through either the top 3 or bottom 4 mirror as indicated in FIG. 13. This figure shows the ratio of the coupling out of the top surface of the resonator to the bottom surface of the resonator for both the long and short wavelength resonator modes, $\lambda_L$ and $\lambda_S$, respectively. This relative change in coupling efficiency is what is exploited to impart amplitude modulation.

The physical mechanism that changes the optical path lengths in the two active regions 5' and 5" is the change in refractive index of the GaAs quantum wells 22 with injected carrier density. This is the same mechanism that gives rise to transient and adiabatic chirp in all semiconductor lasers, a dynamic shift in laser frequency under modulation which ceases as the carrier density in the laser cavity reaches equilibrium. The magnitude of the effect is relatively small, with dn/dN being on the order of $1.2 \times 10^{-20}$ cm$^{-3}$. Given that the quantum wells 22 comprise approximately 15% of the $1\lambda$ active region 5' or 5", this implies that a ~0.05% shift in the optical thickness of the spacers is achievable for a $\Delta N$ of ~1e18 cm$^{-3}$ (a reasonable number). While small, this degree of cavity shift is indeed adequate to achieve a significant (>3 dB) modulation in the output power of the device as is seen in the following.

The dynamic state of this structure is modeled using rate equations for the two carrier populations (upper 10 and lower 11 cavity) and two photon populations (long and short mode). The rate equations are set out in somewhat unconventional form in being in terms of the carrier densities $N_1$ and $N_2$ in the two active regions 5' and 5", and the total photon numbers $S_S$ and $S_L$ in the two optical modes. This is because, in this instance, the concept of expressing the mode equations in terms of photon densities using an equivalent mode volume is not easily accomplished due to the difficulty in defining mode volume in connection with photons. The four coupled differential equations are:

$$\frac{dN_1}{dt} = \frac{\eta_i I_1}{qV_1} - \frac{N_1}{\tau_e} - BN_1^2 - \frac{v_g g_0}{\chi_1} \ln\left(\frac{N_1+N_0}{N_{tr}+N_0}\right) \frac{(\Gamma_1^S S_S + \Gamma_1^L S_L)}{V_1} \quad (16)$$

$$\frac{dN_2}{dt} = \frac{\eta_i I_2}{qV_2} - \frac{N_2}{\tau_e} - BN_2^2 - \frac{v_g g_0}{\chi_2} \ln\left(\frac{N_2+N_0}{N_{tr}+N_0}\right) \frac{(\Gamma_2^S S_S + \Gamma_2^L S_L)}{V_2} \quad (17)$$

$$\frac{dS_S}{dt} = v_g g_0 \left[ \ln\left(\frac{N_1+N_0}{N_{tr}+N_0}\right)\frac{\Gamma_1^S}{\chi_1} + \ln\left(\frac{N_2+N_0}{N_{tr}+N_0}\right)\frac{\Gamma_2^S}{\chi_2} \right] S_S - \frac{S_S}{\tau_{pS}} + \frac{\beta}{2\tau_e}(V_1 N_1 + V_2 N_2) \quad (18)$$

$$\frac{dS_L}{dt} = v_g g_0 \left[ \ln\left(\frac{N_1+N_0}{N_{tr}+N_0}\right)\frac{\Gamma_1^L}{\chi_1} + \ln\left(\frac{N_2+N_0}{N_{tr}+N_0}\right)\frac{\Gamma_2^L}{\chi_2} \right] S_L - \frac{S_L}{\tau_{pL}} + \frac{\beta}{2\tau_e}(V_1 N_1 + V_2 N_2) \quad (19)$$

where, $N_1$, $N_2$: carrier densities in first 5' and second 5" active regions in 1/cm$^3$ $S_S$, $S_L$: photon number in short and long wavelength modes $I_1$, $I_2$: current injection in first 5' and second 5" active regions in amps $V_1$, $V_2$: volume of first 5' and second 5" active region in cm$^3$ B: bimolecular recombination coefficient in cm$^3$/s $\beta$: spontaneous emission factor $g_0$: gain coefficient in 1/cm $N_{tr}$: transparency carrier density in 1/cm$^3$ $N_0$: gain fitting parameter in 1/cm$^3$ $\tau_e$: spontaneous carrier lifetime in seconds $t_{pL}$, $\tau_{pS}$: photon lifetimes of long and short wavelength modes in seconds $v_g$: group velocity in cm/s $\eta_i$: internal quantum efficiency q: elementary charge in Coulombs The $\Gamma$'s are the 2×2 matrix of confinement factors of the two modes with the two active regions 5' and 5", $$\Gamma_{1,2}^{S,L} = \frac{\int_{V1,V2} E_{S,L}^* E_{S,L}\, dV}{\int_{-\infty}^{+\infty} |E_{S,L}|^2\, dV}. \quad (20)$$

For the gain function, we have used the logarithmic expression $$g = g_0 \ln\left(\frac{N_1+N_0}{N_{tr}+N_0}\right). \quad (21)$$

Here, $g_0$ is the gain coefficient in cm$^{-1}$, $N_{tr}$ is the transparency carrier concentration, and $N_0$ is a fitting parameter to account for absorption under low injection $N \ll N_{tr}$. The terms $\chi_1$ and $\chi_2$ account for the gain suppression due to photon saturation $$\chi_i = \sqrt{1 + \frac{(\Gamma_i^S S_S + \Gamma_i^L S_L)}{V_i P_{sat}}} \quad (22)$$

where $P_{sat}$ is the photon saturation density in cm$^{-3}$.

The total power emitted, taken from the top mirror 3 is written as the sum of the power emitted from the short and long wavelength modes $$P = P_S + P_L \quad (23)$$

where $$P_S = \frac{h\nu \eta_{ext}}{\tau_{pS}} \frac{\theta_S}{\theta_S+1} S_S \text{ and } P_L = \frac{h\nu \eta_{ext}}{\tau_{pL}} \frac{\theta_L}{\theta_L+1} S_L. \quad (24)$$

Here, $\eta_{ext}$ is the external quantum efficiency $\alpha_m/(\alpha_m + \alpha_i)$. $\theta_S$ and $\theta_L$ are functions that describe the relative power splitting between the top 3 and bottom 4 mirror for each mode $$\theta = \frac{P_{top}}{P_{bottom}}. \quad (25)$$

In all of the above, the $\Gamma$'s, $\theta$'s, and $\tau_p$'s are all dynamic functions of the carrier densities $N_1$ and $N_2$.

Solving equations (16) through (19) and (23) in the time domain requires expressions as functions of the carrier densities $N_1$ and $N_2$ for the confinement factors $\Gamma_1$ and $\Gamma_2$, the output coupling functions $\theta_S$ and $\theta_L$, and finally for the photon lifetimes $\tau_{pS}$ and $\tau_{pL}$. Rather than resorting to a first-principles analytical treatment for the determination of these functional relationships, a behavioral approach is followed in which the parameters for the structure of FIG. 9 are first calculated using the parameters of FIG. 11, and then they are fitted with an appropriate functional form.

Associated with each mode is a photon lifetime, dependent upon the distributed mirror losses due to material absorption ($\alpha_i$) and transmission through the mirrors ($\alpha_m$):

$$\tau_p = \frac{1}{v_g(\alpha_i + \alpha_m)} \quad (26)$$

where $v_g$ is the group velocity of the mode in question. The distributed mirror loss can be further separated into contributions from the top 3 and bottom 4 mirrors $$\alpha_m = \alpha_m^t + \alpha_m^b \tag{27a}$$

The emission from the device as observed through the top mirror 3 will be proportional to the ratio of the mirror losses $$\theta \propto \frac{\alpha_m^t}{\alpha_m^b} \tag{27b}$$

Requiring that $$\alpha_m = \alpha_m^t + \alpha_m^b = \text{constant} \tag{28}$$

will assure that the modal threshold gain will remain constant, as $\tau_p$ is constant as well. By keeping the modal threshold gain constant, the carrier and photon populations will undergo a minimum perturbation as the mode "sloshes back and forth" between the upper 10 and lower 11 cavities.

The dependence of $d\tau/dn$, the derivative of the photon lifetime with the index difference between the quantum wells in the two active regions $n_{qw1} - n_{qw2}$ on the values of Nt, Nb and Nc needs to be considered. The results show that for Nb−Nt=3, the photon lifetime is invariant with $\Delta n$ under all DBR combinations.

This result merely states that, for $\tau_p$ to remain constant, the reflectivities of the upper 3 and lower 4 DBRs should be the same. The difference of 3 periods accounts for the fact that the upper DBR 3 is terminated in air while the lower DBR 4 is terminated in GaAs 12. Therefore, for the remainder of the modeling exercise, we set Nb−Nt=3, so that, $$\tau_{pL} = \tau_{pS} = \tau_p \tag{29}$$

The output coupling coefficients $\theta_S(N_1, N_2)$ and $\theta_L(N_1, N_2)$ are calculated as the ratios of the Poynting vector magnitudes of the modal e-fields taken at the top 3 and bottom 4 mirrors $$\theta = \frac{|S_{top}|}{|S_{bottom}|}. \tag{30}$$

The long and short wavelength modes are found to be symmetric in $\Delta n$ such that $\theta_L(\Delta n) = \theta_S(-\Delta n)$.

These output coupling coefficients have been found to be quite well approximated by an exponential for small $\Delta n$, and so the functions for the coupling coefficients have been chosen as $$\theta_S = \theta(\Delta n) = Ke^{Q\Delta n} Ke^{Q\frac{dn}{dN}(N_1 - N_2)} \tag{31}$$

$$\theta_L = \theta(-\Delta n) = Ke^{-Q\Delta n} = Ke^{Q\frac{dn}{dN}(N_2 - N_1)}. \tag{32}$$

Equations (31) and (32) are substituted into (24) for the numerical time domain simulation. For each different value of Nc examined, the values for K and Q can be extracted. The values for K and Q are tabulated in FIG. 15.

The maximum power deviation coupled through the top mirror 3 of the device through aperture 13 under modulation can be expressed in the form of an extinction ratio $$ER = \theta(\Delta n)/\theta(-\Delta n) \tag{33}$$

Figure 14:
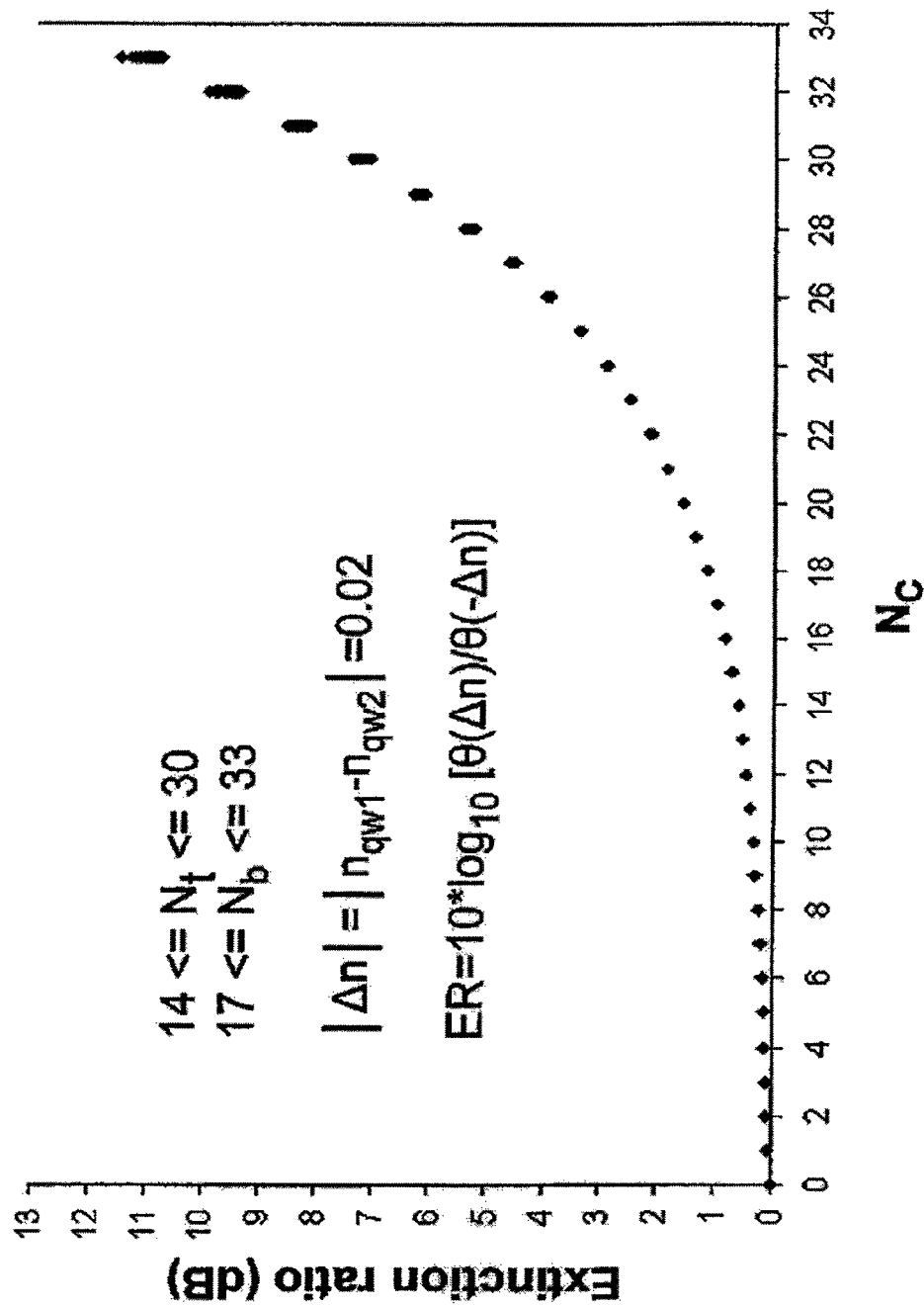
FIG. 14 shows a graph displaying a plot of the extinction ratio ER of a composite resonator vertical cavity laser between on-state and off-state emitted light versus the number of periods of alternating optical index material layers in the bottom, intermediate and top mirrors therein.

This extinction ratio is an important parameter for communication applications, as one wants a large contrast between the amount of light emitted from the device in the on-state and the off-state. Communication standards will often specify a minimum acceptable extinction ratio. FIG. 14 represents the extinction ratio as a function of Nc. Nt is varied from 14 to 30, Nb from 17 to 33, and Nc from 0 to 33. The vertical bars that become more prominent at higher values of Nc corresponds to the range of Nt and Nb that are assumed in the simulation. This plot demonstrates that the extinction ratio is essentially determined solely by the number of intermediate DBR 6 pairs Nc, with very little dependence upon Nt or Nb. Therefore, for a given $\Delta n$, a larger value of Nc will yield an increase in modulation depth.

The confinement factors $$\Gamma_1^S = \Gamma_s^L = \Gamma_1; \Gamma_1^L = \Gamma_2^S = \Gamma_2 \tag{34}$$

can be calculated using equation (20) for various values of Nc, again with Nb−Nt=3. We find that for small $\Delta n$, the confinement factors $\Gamma_1$ and $\Gamma_2$ are reasonably well approximated as linear functions of $\Delta n$, and so express them as $$\Gamma_1 = \Gamma_0 - \frac{d\Gamma}{dn}(n_{qw1} - n_{qw2}) = \Gamma_0 - \frac{d\Gamma}{dn}\frac{dn}{dN}(N_1 - N_2) \tag{35}$$

$$\Gamma_2 = \Gamma_0 + \frac{d\Gamma}{dn}(n_{qw1} - n_{qw2}) = \Gamma_0 + \frac{d\Gamma}{dn}\frac{dn}{dN}(N_1 - N_2) \tag{36}$$

Equations (35) and (36) are substituted into equations (16) through (19) for the numerical time domain simulation. For each different value of Nc examined, we extracted values for $\Gamma_0$ and $d\Gamma/dn$.

Performance was evaluated for numerous cases as Nc was varied from 25 to 50, all with Nt=17 and Nb=20. The values of Nc correspond to an intermediate mirror reflectivity of greater than 99%. FIG. 15 lists the design choices examined, along with the constants used in the behavioral models developed in the previous section. A 5 μm active region aperture 13 is used, although the device concept tolerates a range of apertures.

Performance was evaluated by the measurement of eye diagrams using symmetrical current modulation (i.e. $I_1 = I_{bias} + /- I_{mod}$ and $I_2 = I_{bias} - /+ I_{mod}$) in each cavity and long pattern length pseudorandom pulse sequences. An eye diagram consists of overlapping the signals from a long string of random "1"s and "0"s. An example is shown in the inset picture in FIG. 17. One can see the "1" and "0" levels, as well as the lines corresponding to the transitions between the two states. A high quality signal has a large open area between the two signal levels and the transitions. This corresponds to a condition where there will be few errors transmitting the signal. Along with FIG. 15, other parameters assumed in the rate equations analysis are listed in FIG. 16.

Figure 17:
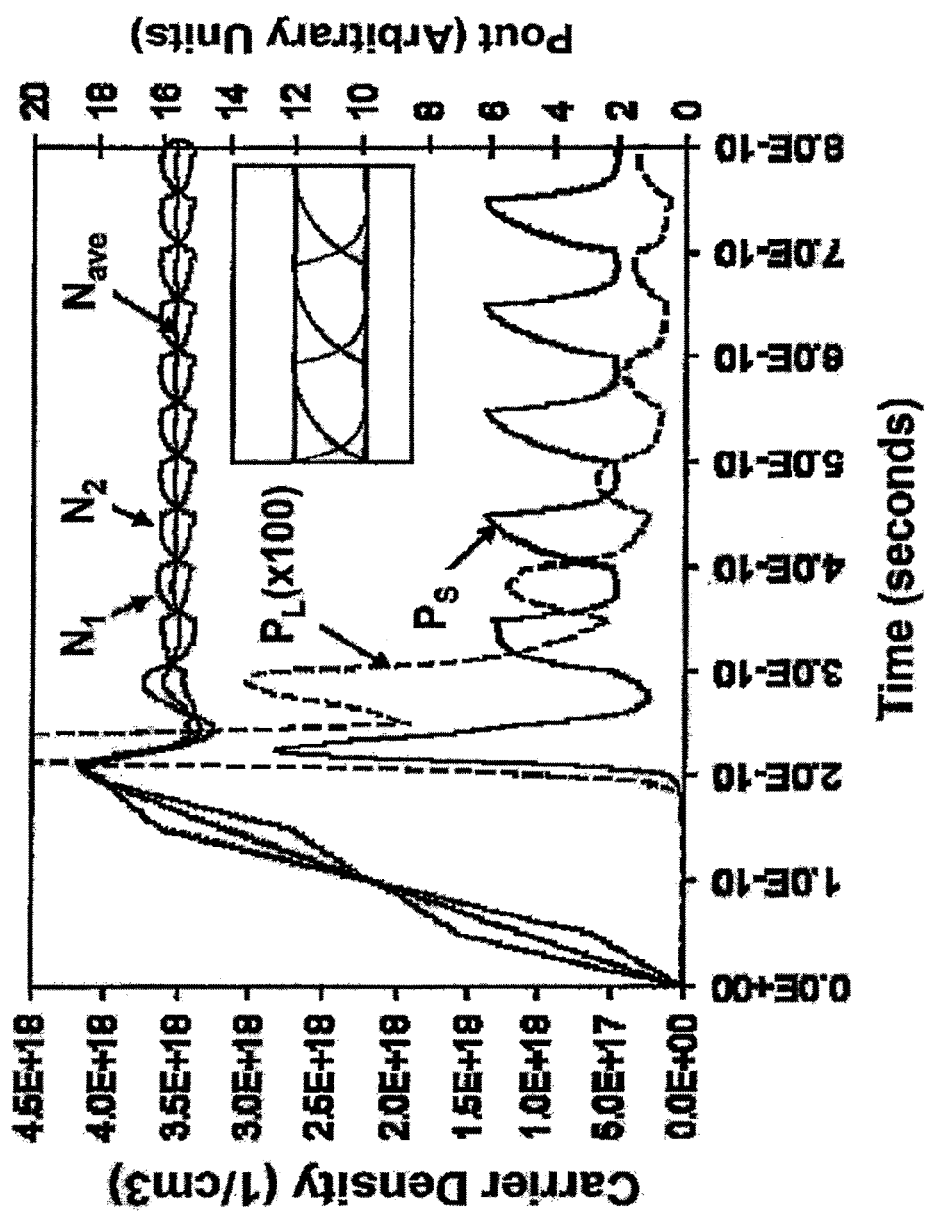
FIG. 17 shows a graph displaying plots of various time domain responses of a composite resonator vertical cavity laser with 44 intermediate mirror periods of alternating optical index material layers operated with $I_{bias}=3.5$ mA and $I_{mod}=1.5$ mA and modulated with a 20 Gbps square wave.

FIG. 17 shows the time domain response of a CRVCL with Nc=44 operated with $I_{bias}$=3.5 mA and $I_{mod}$=1.5 mA modulated with a 20 Gbps square wave. Plotted in the figure are the carrier densities $N_1$ and $N_2$, along with their average carrier density $N_{ave}$. Emitted optical power originating from the long and short wavelength mode is also shown. The long-wavelength mode power is multiplied by a factor of 100 for clarity. In the inset is the eye diagram generated with the pseudorandom bit sequence.

After the initial turn-on transient, the response settles down as in a typical laser response. As expected, the modulation present in the carrier densities is small, with the average being almost flat. The output power is entirely dominated by the short wavelength mode. The modulation of the long mode's confinement factor, and hence its threshold gain, is 180 degrees out of phase with the current modulation in the two active regions. Hence, the long wavelength mode is almost completely suppressed and never reaches threshold.

As shown in the insert, the eye diagram is very clean. There is a complete lack of deterministic jitter and overshoot, in spite of the relatively large extinction ratio and low $I_{bias}$ the average current through the device. Note that the rise and fall characteristics look far different from those of a typical semiconductor laser.

Figure 18:
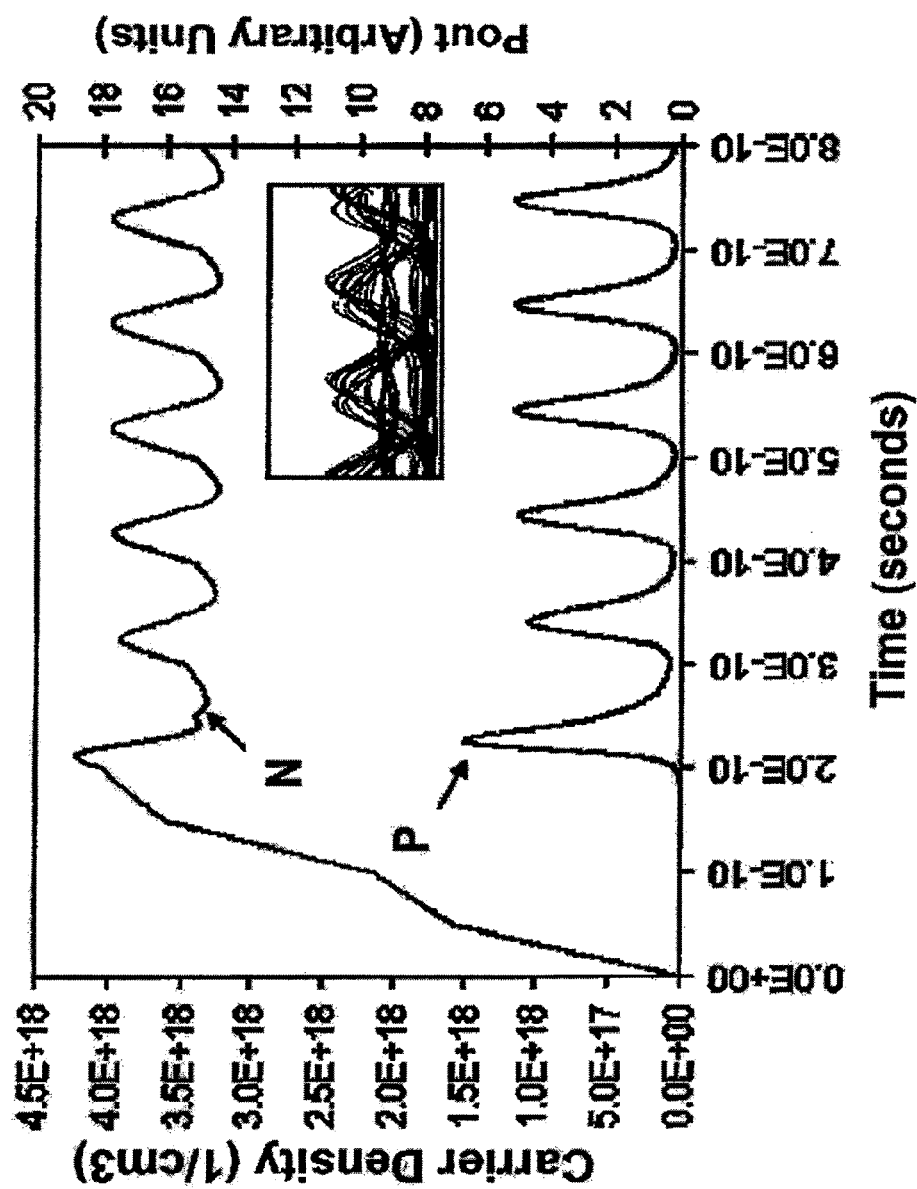
FIG. 18 shows a graph displaying plots of various time domain responses of a vertical cavity surface emitting laser operated with $I_{bias}=3.5$ mA and $I_{mod}=1.5$ mA and modulated with a 20 Gbps square wave.

In contrast, FIG. 18 shows the response of a conventional VCSEL using the same physical parameters as in FIG. 17. Here, the same bias conditions and photon lifetime were used, but the confinement factor was multiplied by 2 to account for the single active region.

In this case, there is a much larger modulation of the carrier density, and there is severe eye diagram closure due to deterministic jitter and overshoot. Certainly, the eye diagram could be improved by increasing the bias current to unrealistic levels, but, when driven at the same current density, the CRVCL has far superior modulation characteristics.

We have found that Nc needs to be larger than 20 periods, or equivalently, the intermediate mirror reflectivity needs to be greater than 99%, for a minimum 2 dB extinction ratio. For other emission wavelengths and materials systems, the intermediate mirror reflectivity requirement of greater than 99% for good extinction ratio remains the same. However, this requirement may result in a different number of intermediate mirror pairs, depending upon the refractive index differences of the materials used in the mirror.

Figure 19:
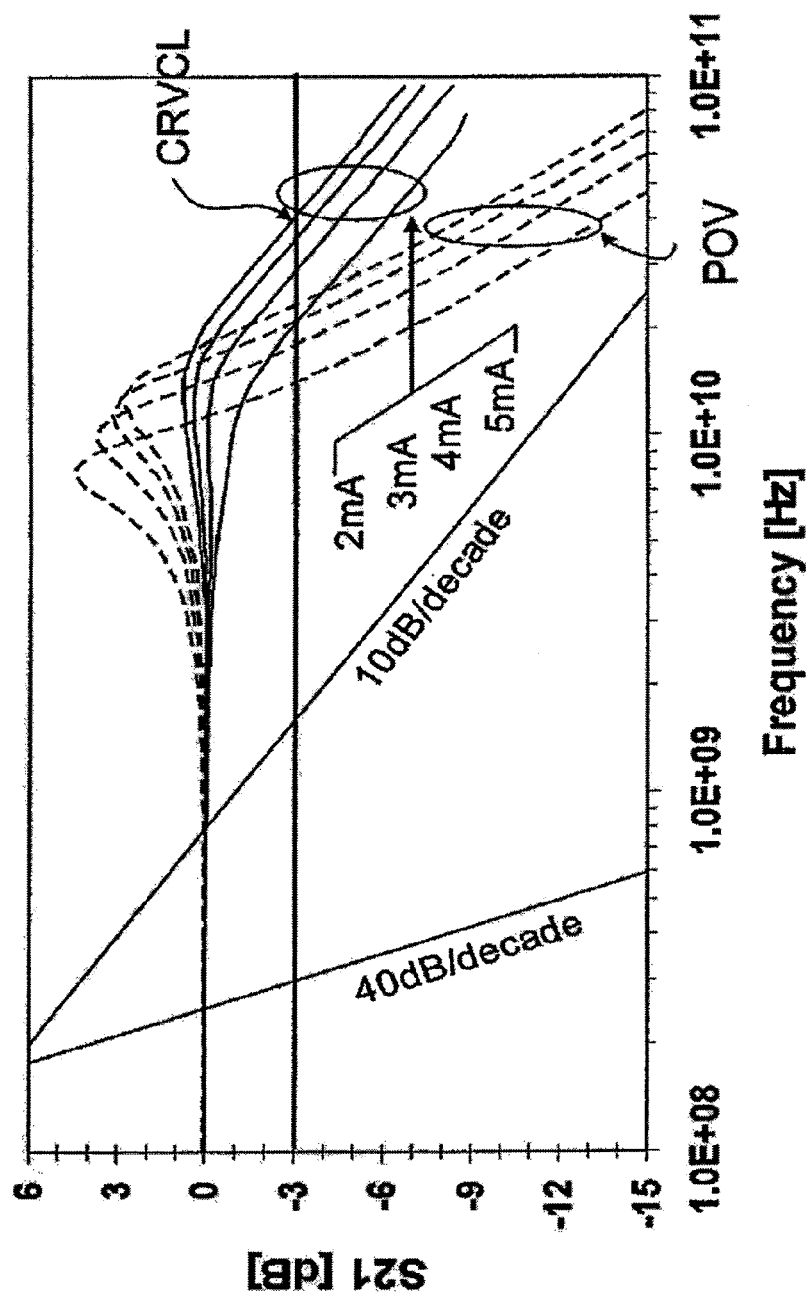
FIG. 19 shows a graph displaying plots of various small signal responses of a composite resonator vertical cavity laser with 50 intermediate mirror periods of alternating optical index material layers in solid lines, and plots of various small signal responses of a vertical cavity surface emitting laser in dashed lines showing a gentler 10 dB/decade roll-off for the composite resonator vertical cavity laser which also has a 3 dB bandwidth double that of the vertical cavity surface emitting laser for the same operating electrical current.

Small signal scattering parameter $S_{21}$ response characteristics were examined for a CRVCL with Nc=50 and a conventional VCSEL with the same material parameters, aperture size, and photon lifetime. $S_{21}$ is a forward transmission coefficient, and describes the ratio of an output signal (optical in this case) to an input signal (electrical in this case) for the CRVCL. The $S_{21}$ curves for the CRVCL are the four solid lines, and the $S_{21}$ signal curves for the conventional VCSEL are the dotted lines. FIG. 19 shows the results for bias currents of 2 to 5 mA and 0.1 mA modulation depth for both types of devices. For the two structures, the relaxation oscillation frequency is essentially the same, but the CRVCL shows much lower peaking and a gentler roll-off of 10 dB/decade, leading to a substantially improved 3 dB bandwidth. This result is consistent with the small signal analysis provided above.

Figure 20:
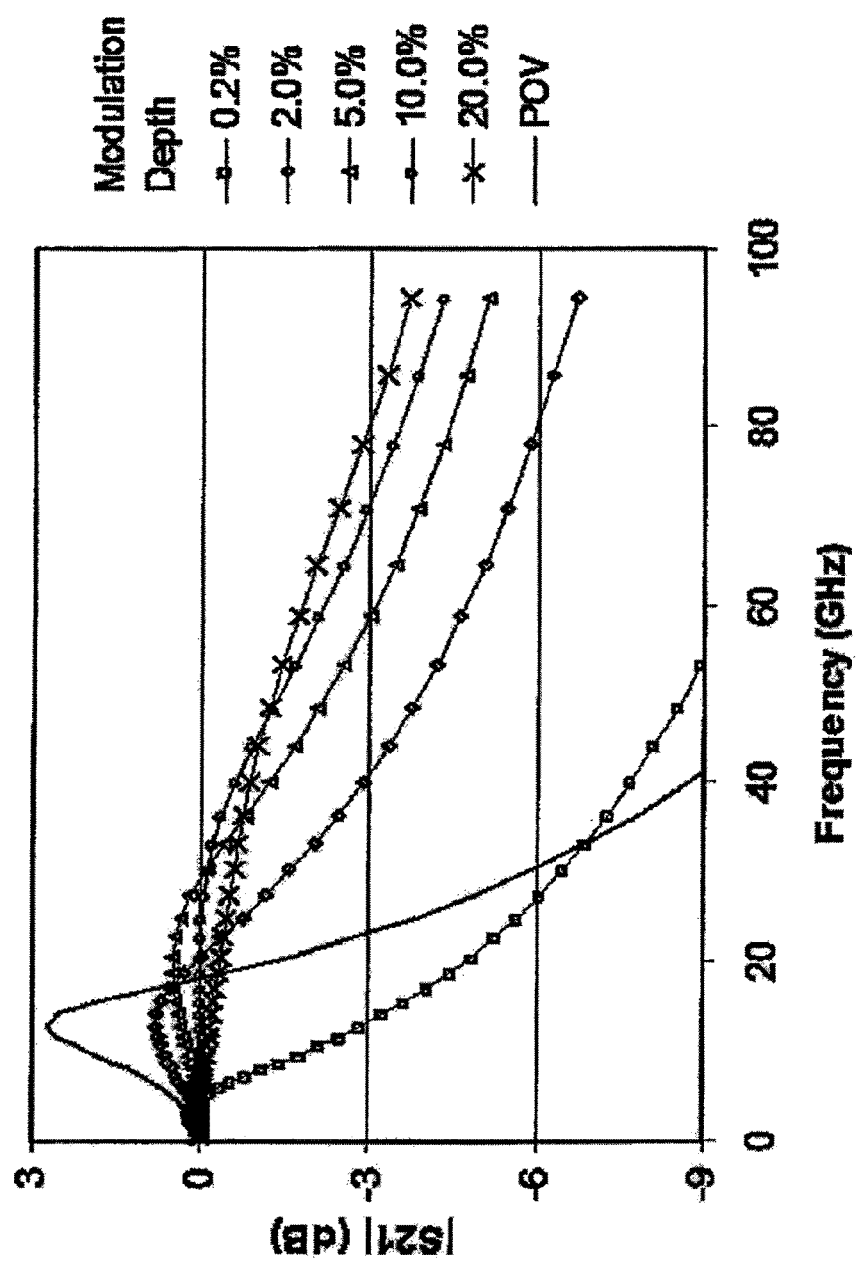
FIG. 20 shows a graph displaying plots of various small signal responses for different modulations depths $I_{mod}/I_{bias}$ of a composite resonator vertical cavity laser with 50 intermediate mirror periods of alternating optical index material layers, and a plot of the small signal response of a vertical cavity surface emitting laser that is independent of modulation depth.
Figure 21:
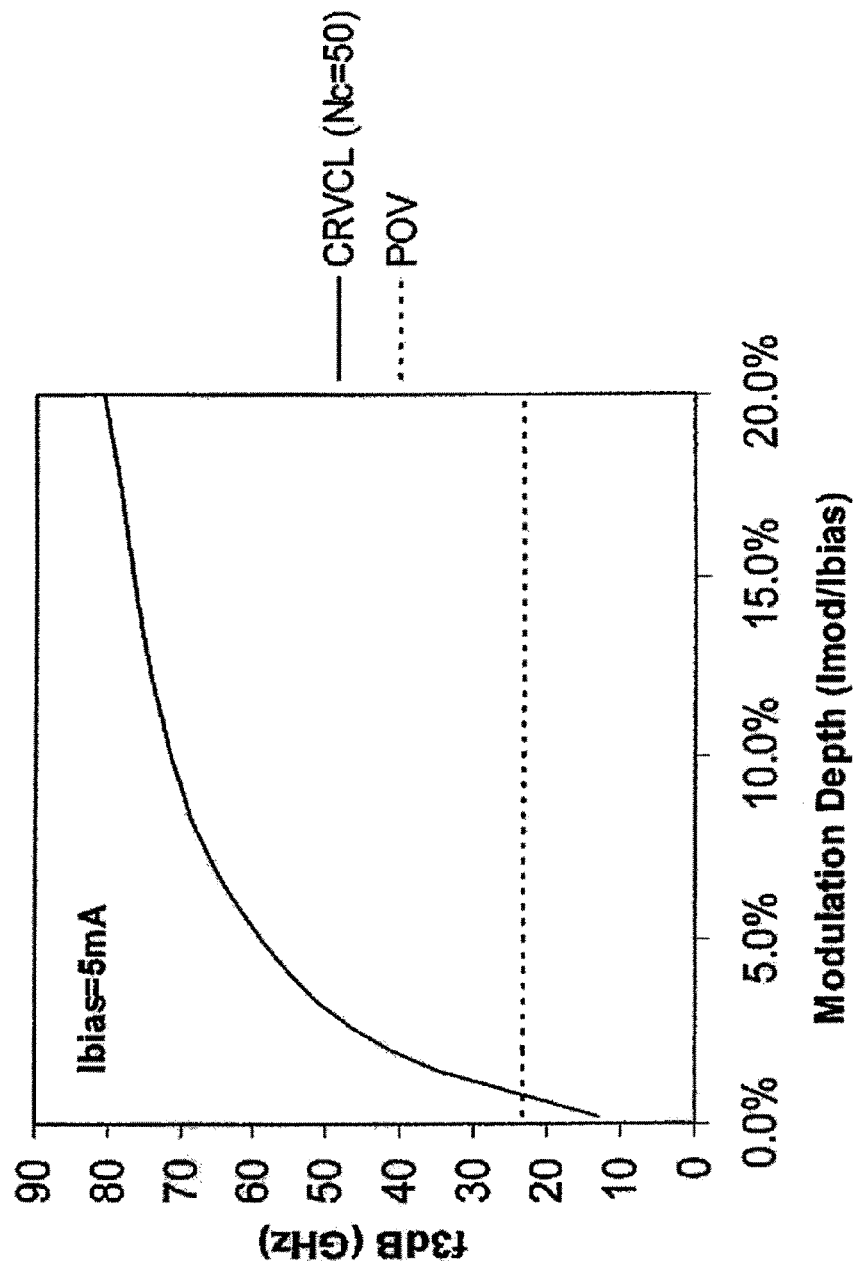
FIG. 21 shows a graph displaying plots of 3 dB modulation bandwidth as a function of modulation depth of a composite resonator vertical cavity laser with 50 intermediate mirror periods of alternating optical index material layers and a vertical cavity surface emitting laser.

The CRVCL 3 dB bandwidth is shown to improve with modulation depth. FIG. 20 shows the calculated small signal $S_{21}$ response for a CRVCL (Nc=50) for different values of modulation depth $I_{mod}/I_{bias}$. For a modulation depth of 20%, the 3 dB frequency exceeds 80 GHz. This is in contrast to the more typical behavior of the conventional VCSEL (also shown) which is independent of modulation depth as shown in FIG. 21. When compared to the conventional VCSEL, there is a factor of four increase in modulation bandwidth at a given current density.

Figure 22:
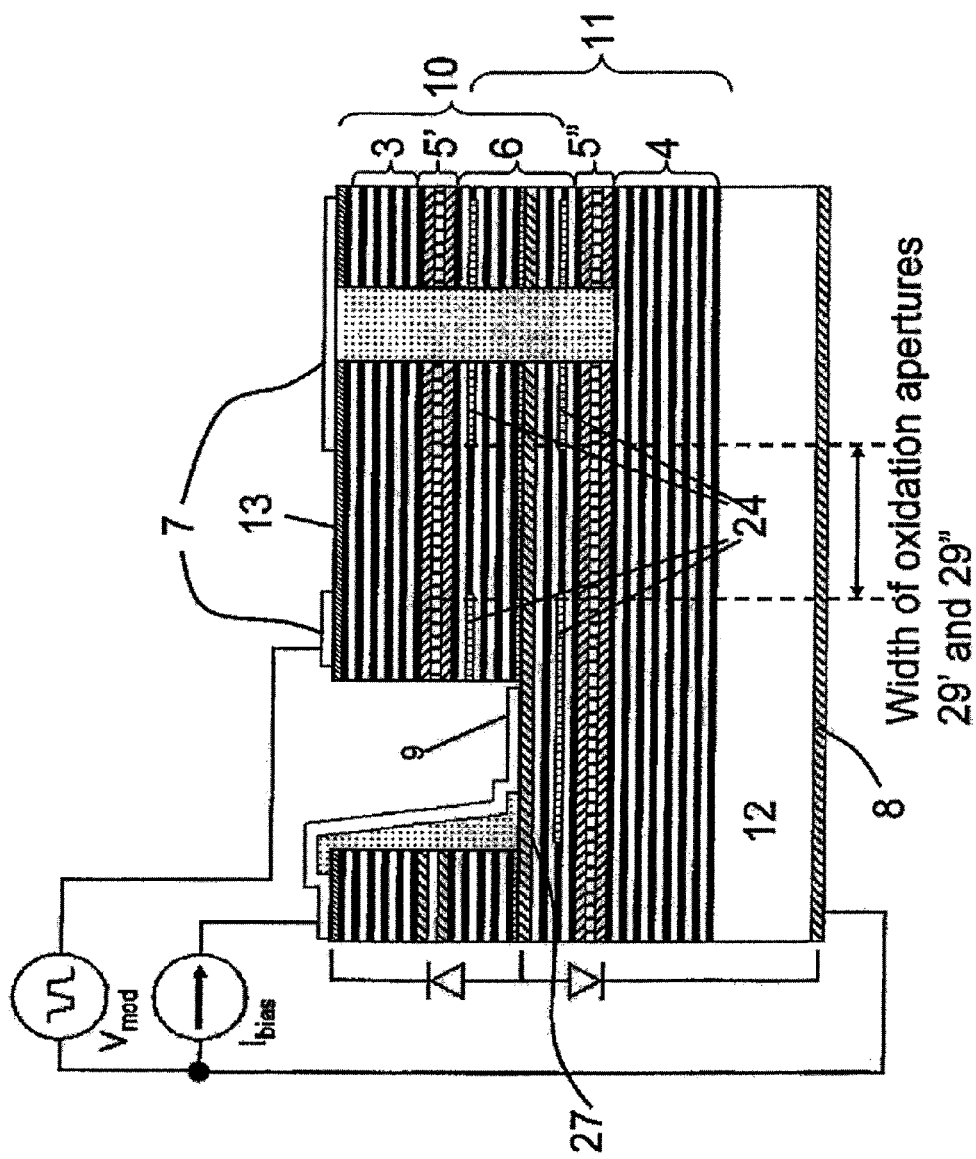
FIG. 22 shows a diagrammatic cross section view of a composite resonator vertical cavity laser in another circuit arrangement providing for push-pull modulation and suitable operating bias current.

FIG. 22 shows a more detailed cross section view of an example of the CRVCL of the present invention. The device includes two 5QW 22 1λ active regions 5' and 5", dual oxide apertures 29' and 29" for current confinement in the upper and lower cavities, a highly doped intracavity contact layer 27, and a GaInP 26 etch stop for the intracavity contact 9 etch.

Also shown in the figure is a bias and modulation arrangement example for the push-pull mode of operation. Bias is applied via a current source to the intracavity contact 9, whereas the modulating voltage is applied to the upper cavity via a topside contact 7. As the device behaves in a circuit sense essentially as a back-to-back diode, modulating the device in such fashion directly leads to the desired differential modulation of the cavity currents. This arrangement allows for the minimization of the bonding pad size, and avoids any parasitics which might otherwise be a factor should modulation have been applied via the intracavity contact. In any case, minimizing stray parasitics is important.

Figure 23:
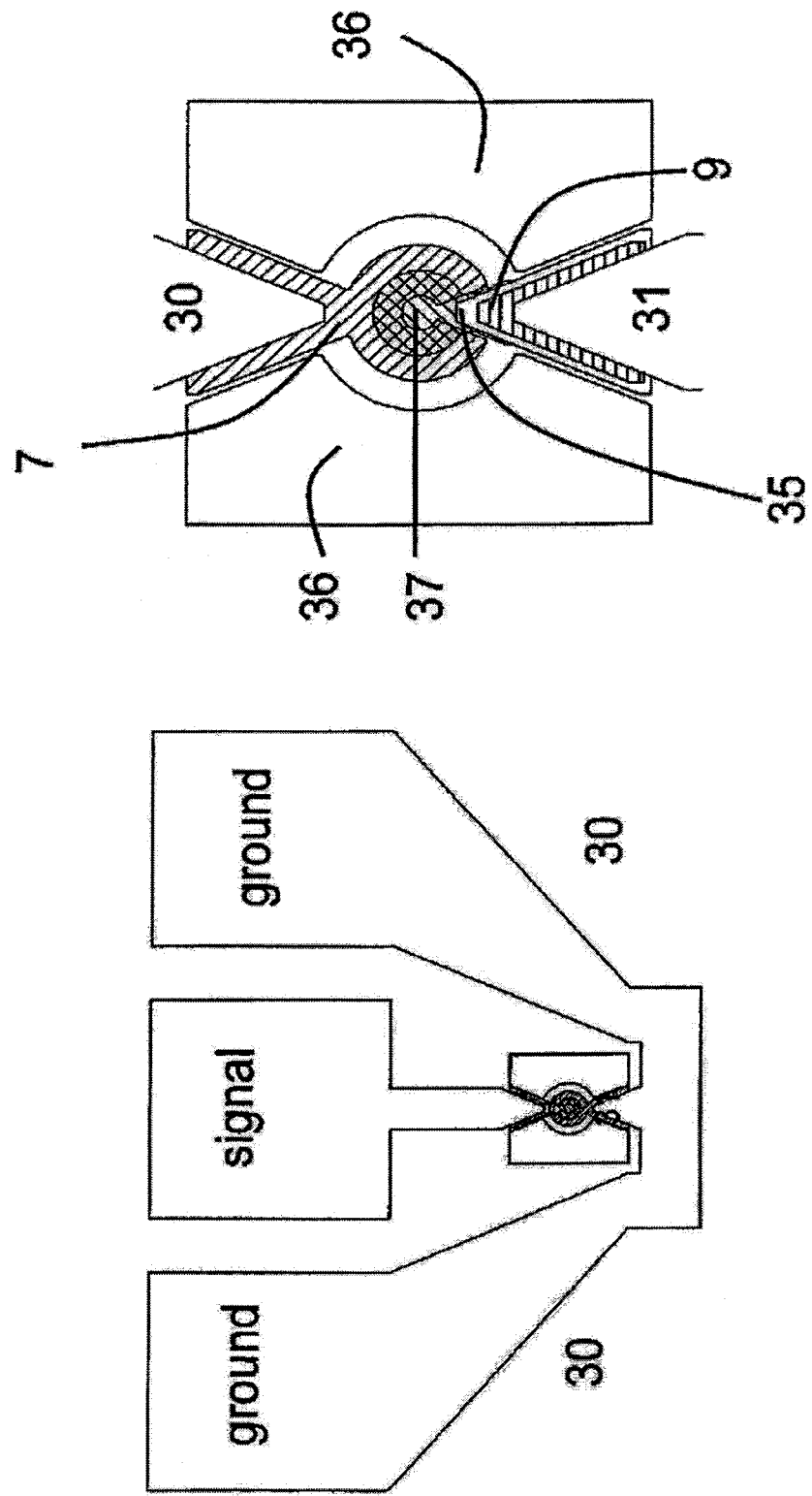
FIG. 23 shows a diagrammatic top view of a composite resonator vertical cavity laser structure showing major structural features and a "ground-signal-ground" contact layout.

As shown in FIG. 23, which is a view of the device from the topside of the chip, the example device employs a "bow tie" contact structure. The upper terminal 7 metal contact comes from one side of the device, while the intermediate terminal 9 metal contact comes to the other side of the device. A ground 29-signal 30-ground 29 bond pad arrangement is used to enable wirebonding or on-chip probing, or both, using coplanar waveguide probes. The ground 29 bond pads are attached to the lower terminal 9, while the signal bond pad 30 is attached to the upper terminal 7 metal. The ground-signal-ground (G-S-G) is a standard arrangement for the application of very high frequency signals.

The epitaxial structure in the device example contains 17 to 20 top 3 n-doped DBR pairs, 20 to 23 bottom 4 n-doped DBR pairs, and 38 to 50 intermediate 6 p-doped DBR pairs. All DBRs consist of x=0.15/x=0.95 AlGaAs layers 18, 19 with 20 nm linear compositional and doping grades 20 to reduce the series resistance. The p DBRs and n DBRs are doped 3e18 $cm^{-3}$ and ~2e18 $cm^{-3}$ respectively, with the doping in the 6 pairs adjacent to the cavities reduced by ~50% to reduce free carrier absorption. The 5 central mirror pairs in the low field region of the intermediate DBR are highly doped (p>5e18 $cm^{-3}$) for improved current spreading, with one pair doped>2e19 $cm^{-3}$ to facilitate the Ti/Au unalloyed ohmic contact 9, which is made to a 12 nm thick GaAs layer 27 placed at a standing wave node to minimize absorption. Adjacent to and immediately above the contact layer is a 10 nm thick GaInP layer 26 for use as an etch stop during the intracavity contact etch. A 15 nm thick GaAs ohmic contact layer doped n>>8e18 $cm^{-3}$ caps off the structure 25.

The active regions 5' and 5" each have five undoped 7 nm thick GaAs quantum wells 22 with 6 nm thick barriers 23 of undoped x=0.25 AlGaAs between the quantum wells and 20 nm of the barrier material on either side of the quantum well region. The remaining cavity spacer material is of low doped (n,p<5e17 $cm^{-3}$) x=0.65 AlGaAs 21.

The oxide aperture layers 24 consist of 20 nm thick x=0.98 AlGaAs 32, bounded on one side by 12 nm of x=0.97 AlGaAs 33, and x=0.65 AlGaAs 34 on the other. This design yields a slightly tapered oxide "tip" in order to reduce diffraction losses.

The process flow requires 6 photolithographic steps, represented by the individual layers in sequence:
 a. Intracavity contact etch
 b. Mesa/trench etch
 c. Isolation implant
 d. Intracavity contact ohmic metallization
 e. Topside ohmic metal
 f. Thick interconnect and bondpad metal FIG. 24 shows the overlay of each of the mask layers used to define each feature.

Referring to FIGS. 22 through 24, one possible fabrication procedure involves first depositing a ¼λ. SiN dielectric layer to passivate the optical aperture and serve as contact protection during the wet oxidation step. Next, a Cl2-based dry etch using inductively coupled plasma reactive ion etching exposes the intra-cavity contact etch area 35, followed by an HCL wet etch of the GaInP etch stop to expose the GaAs contact layer. Another ¼λ SiN layer is then deposited to protect the contact layer during the subsequent dry etch of the mesa trench area 36 to expose the x=0.98 AlGaAs selective oxidation layers 32. A wet oxidation step turns the x=0.98 layers into aluminum oxide (Al$_2$O$_3$). This process is stopped before reaching the center of the mesa (~10 µm nominal lateral oxidation distance) to form two oxide apertures 29' and 29". In these apertures the aluminum oxide is insulating, but the unoxidized region is still conducting, and hence a guide for current is created. Following the oxidation, a high-energy (>380 keV) multi-step proton implant through an 8 µm thick photoresist mask is used to electrically isolate the devices from each other and intracavity anode from the cathodes. The photoresist mask creates an unimplanted region 37 that protects the contact regions 7 and 9, as well as the device emitting aperture 13. Implanting after the mesa etch ensures complete isolation of the bottom DBR. The intracavity metal contacts 9 are then patterned for liftoff, followed by a CF$_4$ dry etch of the nitride and deposition of the Ti/Pt/Au contact metal. After patterning and deposition of the Ni/Ge/Au metallization of the topside ohmic contacts 7, the top surface of the device is planarized with Cyclotene(BCB), followed by deposition of 1.6 µm thick Ti/Au metal forming the interconnect metal and ground-signal-ground (GSG) coplanar waveguide contacts 30 and 31. Finally, the wafer is thinned to ~6 mils, metallized with Ni/Ge/Au to form the bottom terminal 8 metal contact and alloyed at >380 C. to activate the ohmic contacts.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

What is claimed is:

1. An apparatus comprising:
a semiconductor optical-output device formed on a substrate, wherein the optical-output device includes:
   a first electrically conductive mirror structure;
   a second electrically conductive mirror structure;
   a third electrically conductive mirror structure;
   a first active region optically and electrically located in a first optical cavity between the first mirror structure and the second mirror structure;
   a second active region optically and electrically located in a second optical cavity between the second mirror structure and the third mirror structure;
   a first electrical terminal electrically connected to the first mirror structure;
   a second electrical terminal electrically connected to the second mirror structure;
   a third electrical terminal electrically connected to the third mirror structure, wherein electrical current between the first electrical terminal and the second electrical terminal passes through the first active region, and electrical current between the third electrical terminal and the second electrical terminal passes through the second active region;
   a current source operatively coupled to apply a first constant-current value of forward-bias current to the first active region and to apply a second constant-current value of forward-bias current to the second active region; and
   a signal source operatively coupled to add a modulation-current signal to the forward-bias current applied to the first active region and to subtract the modulation-current signal from the forward-bias current applied to the second active region.

2. The apparatus of claim 1, wherein the second mirror structure has a reflectivity of at least about 99%.

3. The apparatus of claim 1, wherein the semiconductor optical-output device has a lasing wavelength of approximately 850 nm.

4. The apparatus of claim 1, wherein the first mirror is a distributed Bragg reflector that has a plurality of layer pairs and the third mirror is a distributed Bragg reflector that has a plurality of layer pairs.

5. The apparatus of claim 1,
wherein the first mirror includes a negative-conductivity-type semiconductor distributed Bragg reflector that has a plurality of layer pairs, the second mirror includes a positive-conductivity-type semiconductor, and the third mirror includes a negative-conductivity-type semiconductor distributed Bragg reflector that has a plurality of layer pairs, and
wherein the first active region includes a plurality of quantum wells and the second active region includes a plurality of quantum wells.

6. The apparatus of claim 1, wherein the first mirror is a distributed Bragg reflector that has a plurality of layer pairs, the second mirror is a distributed Bragg reflector that has a plurality of layer pairs, and the third mirror is a distributed Bragg reflector that has a plurality of layer pairs, wherein the first, second and third distributed Bragg reflector each further includes a graded-composition region located between each layer of a plurality of their layer pairs, wherein each graded-composition region changes in composition to reduce electrical series resistance.

7. The apparatus of claim 1, wherein a central axis of the device's optical path is a straight line that is perpendicular to planar surfaces of the layer pairs of the first mirror structure and that is perpendicular to planar surfaces of the layer pairs of the second mirror structure and that is perpendicular to planar surfaces of the layer pairs of the third mirror structure.

8. The apparatus of claim 1, wherein the first optical cavity and the second optical cavity are each VCSEL structures that couple to one another to form a composite resonator, and wherein the first optical cavity and the second optical cavity have different lengths in order to detune the composite resonator.

9. The apparatus of claim 1, further comprising an etch-stop layer embedded within the second mirror structure and configured to provide etch selectivity between the etch-stop layer and layers located further from the substrate than the etch-stop layer.

10. The apparatus of claim 1, further comprising an etch-stop layer embedded within the second mirror structure and configured to provide etch selectivity between the etch-stop layer and layers located further from the substrate than the etch-stop layer, and at least one highly doped semiconductor layer located between the etch-stop layer and the substrate and configured to provide a low-resistance ohmic contact to the second mirror structure.

11. An apparatus comprising:
a composite-resonator laser that includes a plurality of serially coupled semiconductor vertical cavity surface emitting lasers (VCSELs), including a first VCSEL and a second VCSEL operated in a push-pull mode;
a current source operatively coupled to apply a first constant-current value of forward-bias current to the first VCSEL and to apply a second constant-current value of forward-bias current to the second VCSEL; and a signal source operatively coupled to add a modulation-current signal to the forward-bias current applied to the first VCSEL and to subtract the modulation-current signal from the forward-bias current applied to the second VCSEL.

12. The apparatus of claim 11 further comprising,
a modulation-driver circuit configured to drive the signal source with a signal having a modulation bandwidth of more than 40 GHz.

13. The apparatus of claim 11, further comprising a partially transmissive cavity-coupling mirror that couples a cavity of the first VCSEL to a cavity of the second VCSEL, wherein the partially transmissive cavity-coupling mirror has a reflectivity of at least about 99%.

14. The apparatus of claim 11, wherein the composite-resonator laser has a lasing wavelength of approximately 850 nm.

15. The apparatus of claim 11, further comprising:
a partially transmissive cavity-coupling mirror that couples a cavity of the first VCSEL to a cavity of the second VCSEL, wherein the partially transmissive cavity-coupling mirror has a reflectivity of at least about 99%;
a first distributed Bragg reflector (DBR) operatively coupled to the first VCSEL, wherein the first VCSEL further includes a first multiple-quantum-well (MQW) active region located between the first DBR and the partially transmissive cavity-coupling mirror;
a second DBR operatively coupled to the second VCSEL, wherein the second VCSEL further includes a second MQW active region located between the second DBR and the partially transmissive cavity-coupling mirror; and
a plurality of electrical connections operatively coupled to the plurality of VCSELs and configured to deliver current from the signal source to control the first and second active regions.

16. A method for making an optical-output device, the method comprising:
providing a semiconductor substrate;
forming a first electrically conductive mirror structure on the substrate;
forming a first active region on the first electrically conductive mirror structure;
forming a second electrically conductive minor structure on the first active region to form a first cavity between the first mirror structure and the second mirror structure;
forming a second active region on the second electrically conductive mirror structure;
forming a third electrically conductive mirror structure on the second active region to form a second cavity between the third mirror structure and the second mirror structure;
forming a first electrical terminal electrically connected to the first mirror structure;
forming a second electrical terminal electrically connected to the second mirror structure;
forming a third electrical terminal electrically connected to the third mirror structure, such that electrical current passing between the first electrical terminal and the second electrical terminal passes through the first active region, and electrical current passing between the third electrical terminal and the second electrical terminal passes through the second active region; and
applying a first constant-current value plus a modulation-current signal of forward-bias current to the first active region; and applying a second constant-current value minus the modulation-current signal of forward-bias current to the second active region.

17. The method of claim 16,
wherein the forming of the first mirror includes epitaxially growing a monolithic stack of layers to form a plurality of distributed Bragg reflector layers, and
wherein the forming of the third mirror includes epitaxially growing a monolithic stack of layers to form a plurality of distributed Bragg reflector layers.

18. The method of claim 16,
wherein the forming of the first mirror includes epitaxially growing a monolithic stack of layers to form a plurality of negative-conductivity-type semiconductor distributed Bragg reflector layers,
wherein the forming of the second mirror includes epitaxially growing a monolithic stack of layers to form a plurality of positive-conductivity-type semiconductor distributed Bragg reflector layers,
wherein the forming of the third mirror includes epitaxially growing a monolithic stack of layers to form a plurality of negative-conductivity-type semiconductor distributed Bragg reflector layers,
wherein the forming of the first active region includes epitaxially growing a monolithic stack of layers to form a plurality of quantum wells, and
wherein the forming of the second active region includes epitaxially growing a monolithic stack of layers to form at least one quantum well.

19. The method of claim 16,
wherein the forming of the first mirror includes epitaxially growing a monolithic stack of layers to form a plurality of adjoining distributed Bragg reflector layers and grading a material composition in regions between adjoining layers to reduce electrical series resistance,
wherein the forming of the second mirror includes epitaxially growing a monolithic stack of layers to form a plurality of adjoining distributed Bragg reflector layers and grading a material composition in regions between adjoining layers to reduce electrical series resistance, and
wherein the forming of the third mirror includes epitaxially growing a monolithic stack of layers to form a plurality of adjoining distributed Bragg reflector layers and grading a material composition in regions between adjoining layers to reduce electrical series resistance.

20. The method of claim 16,
wherein the forming of the first mirror includes epitaxially growing a monolithic stack of layers to form a plurality of adjoining distributed Bragg reflector layers and grading a material composition in regions between adjoining layers,
wherein the forming of the second mirror includes epitaxially growing a monolithic stack of layers to form a plurality of adjoining distributed Bragg reflector layers and grading a material composition in regions between adjoining layers,
wherein the forming of the third mirror includes epitaxially growing a monolithic stack of layers to form a plurality of adjoining distributed Bragg reflector layers and grading a material composition in regions between adjoining layers,
wherein the forming of the first active region includes epitaxially growing a monolithic stack of layers to form a plurality of quantum wells, wherein the forming of the second active region includes epitaxially growing a monolithic stack of layers to form a plurality of quantum wells; and wherein the distributed Bragg reflector layers are configured to cause lasing at a wavelength of approximately 850 nm.

* * * * *